United States Patent
Tsuji et al.

(10) Patent No.: US 6,437,774 B1
(45) Date of Patent: Aug. 20, 2002

(54) DISPLAY AND INPUT DEVICE AND DISPLAY AND INPUT SYSTEM

(75) Inventors: Yoshitaka Tsuji; Masahiko Kawakami; Tomonori Nishiki; Toshihiro Fujita; Akito Okamoto; Hiromasa Hasegawa; Hongguang Li; Shigeto Ogino, all of Osaka (JP)

(73) Assignee: Idec Izumi Corporation (JP)

( * ) Notice: Subject to any disclaimer, the term of this patent is extended or adjusted under 35 U.S.C. 154(b) by 0 days.

(21) Appl. No.: 09/319,045
(22) PCT Filed: Sep. 29, 1998
(86) PCT No.: PCT/JP98/04368
§ 371 (c)(1),
(2), (4) Date: May 28, 1999

(30) Foreign Application Priority Data

Mar. 26, 1996 (JP) ................................................ 8-70199
Sep. 30, 1997 (JP) ............................................... 9-267135

(51) Int. Cl.[7] ................................................ G09G 5/00
(52) U.S. Cl. ........................ 345/173; 345/146; 345/156
(58) Field of Search ............................... 345/173, 146, 345/156

(56) References Cited

U.S. PATENT DOCUMENTS

| | | | | |
|---|---|---|---|---|
| 5,132,681 A | * | 7/1992 | Yabe et al. | 340/825.55 |
| 5,491,507 A | * | 2/1996 | Umezawa et al. | 348/14.02 |
| 5,578,816 A | * | 11/1996 | Fukatsu | 250/221 |
| 5,675,524 A | * | 10/1997 | Bernard | 708/109 |
| 5,742,476 A | * | 4/1998 | Miyazaki et al. | 361/683 |
| 5,844,556 A | * | 12/1998 | Takitani et al. | 345/339 |
| 5,982,355 A | * | 11/1999 | Jaeger et al. | 345/161 |
| 6,140,987 A | * | 10/2000 | Stein et al. | 345/87 |

FOREIGN PATENT DOCUMENTS

| | | | | |
|---|---|---|---|---|
| JP | 5970244 | 5/1984 | | G06F/3/023 |
| JP | 59146821 | 10/1984 | | H01H/9/18 |
| JP | 6352225 | 4/1988 | | H01H/9/16 |
| JP | 475219 | 3/1992 | | G09G/5/36 |
| JP | 8-297533 | 11/1996 | | |

* cited by examiner

Primary Examiner—Mark Zimmerman
Assistant Examiner—Mackly Monestime
(74) Attorney, Agent, or Firm—Ostrolenk, Faber, Gerb & Soffen, LLP

(57) ABSTRACT

In a display and input device (CP) displaying information on a display (DP) and performing changing of the information and communication through switch operating means (CSW1), the switch operating means (CSW1) are arranged on the left and right edges of the display (DP), opaque members among members forming the switch operating means (CSW1) are arranged outside the screen of the display (DP), and only transparent members are arranged on the display (DP). Thus, a switch operation can be performed while recognizing functions of the switch operating means (CSW1) and the switch operating means (CSW1) having the stroke feeling and click feeling of a mechanical switch so that an operating environment having excellent operability and implementing reliable input can be obtained.

13 Claims, 30 Drawing Sheets

ARROW B

DISPLAY AND INPUT DEVICE AND DISPLAY AND INPUT SYSTEM

TECHNICAL FIELD

The present invention relates to a display and input device such as an FA controller or a notebook loaded with an arithmetic processing mechanism having a display such as a cathode-ray tube or a liquid crystal display panel and input means such as switch operating means attached thereto and a display and input system.

BACKGROUND ART

As a display and input device having a display and input means for changing representation on the display or performing an input operation to another device on the basis of information inputted through the operation input means, there is an electronic notebook loaded with an arithmetic processing mechanism, an FA controller or the like. It can be said that a personal computer system or the like having a display is also a display and input device having a display capable of variable display and switch operating means such as a keyboard which is input means.

FIG. 1 is a diagram showing an FA controller CP101 operating a robot or the like as an exemplary display and input device. The controller CP101 inputs an operation instruction to the robot or the like employing switch operating means MSW101 having a mechanical mechanism, for causing a display DP101 to display various information for confirming the input information and comprehending the operating state of the robot. However, the display and input device having such a mode has such problems that it is hard for the user to recognize the association between the displayed information and the switch operating means MSW101 since the display DP101 and the switch operating means MSW101 are separate from each other and there is a high possibility of making erroneous input through a "feeling operation" of performing the operation only with the feeling of his fingers without observing the switch operating means MSW101.

Thus, various display and input devices have been developed so that the association between representation on a display and representation on switch operating means is easy to comprehend. FIG. 2 is a diagram showing an FA controller CP102 which is an example thereof. In the controller CP102, switch operating means MSW102 are arranged around a display DP102 thereby rendering the association between information displayed on the display DP102 and the switch operating means MSW102 readily recognizable. When the representation on the display DP102 and the switch operating means MSW102 are thus arranged, it follows that the user performs an unnatural operation of pushing the switch operating means MSW102 without observing the same since the representation on the display DP102 and the representation on the positions of the switch operating means MSW102 do not completely match with each other, so the tendency of pushing the switch operating means MSW102 without observing the display DP102 intensifies, and the tendency of performing a feeling operation further increases, leading to deterioration the reliability of the operation.

There has also been developed a display and input device completely matching representation on a display and representation on switch operating means with each other for eliminating such an unnatural operation. FIG. 3 shows an FA controller CP103 which is an example thereof, provided with a touch switch through which input is performed by touching a surface of a display DP103 with a finger or the like. The display DP103 is rendered to display the shape of switch operating means, so that information is inputted through the touch switch on the display by touching display ISW103 of this switch operating means. Therefore, the user can confirm the operation of pushing the switch operating means while observing the displayed image of a screen, and can reliably perform the operation.

When the user handles the display and input device, as described above, the association between the displayed image and the input means such as the switch operating means is clarified and a reliable operation is enabled as the positional relation thereof is close. Consequently, it can be said that to provide the switch operating means on the display is the most operable and desirable positional relation.

When using a touch switch or the like as the switch operating means on the display, visual confirmation of the switch is indeed easy to perform but the touch switch, hardly having the amount of movement of a switch operation and hence failing to provide the same feeling of pushing, is usually repeatedly pushed. Since, a touch switch does not have the same amount of movement of a mechanical switch further, it cannot cope with a human-unique motion of stopping the switch operation halfway, and therefore has a problem that information input is performed if a switch display part is slightly touched.

When simply arranging mechanical switch operating means on a display, it follows that an opaque part specific to the switch operation means exists on the display and hence there arises a problem that the representation is extremely hard to observe for the user. When the opaque part exists on the display, further, the displaying mode of the display is so limited that no image can be displayed on the overall surface of the display, for example, and the overall representation cannot be effectively utilized.

OBJECTS OF THE INVENTION

It is a first object of the present invention to provide a display and input device providing switch operating means on a display while maintaining operation feeling of a switch operation and implementing no existence of an opaque part of the switch operating means on the display, for consequently implementing excellent operating environment which can manage both with improvement of reliability of the switch operation and effective use of the display.

It is a second object thereof to provide, in a case of providing a display and input device having switch operating means provided on a display with portability, to provide a display and input device implementing excellent operating environment for an operator grasping the device.

SUMMARY

The present invention is directed to a display and input device for displaying information and accepting input operation, which comprises a display displaying information and switch operating means over-arranged on a peripheral edge portion of the display with a part overlapping on the display formed by a transparent member, and further comprises display control means causing the display to display information and causing a part of the display provided with the switch operating means to display a selection menu for switching, and changing means changing representation on the display in response to operation of the switch operating means.

According to the present invention, the transparent member of the switch operating means exists on the display, whereby the user can readily recognize the association between the menus which is the representation of the switch operating means and the actual switch operating means. Thus, erroneous input can be prevented.

According to the present invention, further, no opaque member forming the switch operating means exists on the display but it is possible to display an image on the overall display including the switch operating means while employing the switch operating means as the menu, and a screen can be effectively utilized.

In a preferred embodiment of the present invention, the switch operating means has a transparent switch operating body displaced by a press operation onto the switch operating means; a transparent touch switch provided on the display for performing a switching operation through the displacement of the switch operating body; first magnetic means mounted on the switch operating body; and second magnetic means arranged outside the peripheral edge portion of the display to be opposed to the first magnetic means, and the pressed switch operating body returns to an unpressed state due to magnetic interaction between the first magnetic means and the said second magnetic means.

In another preferred embodiment of the present invention, the switch operating means has a transparent switch operating body displaced by a press operation onto the switch operating means; and opaque switch means provided outside the peripheral edge portion of the display for performing a switching operation due to displacement of the switch operating body.

In the preferred embodiments of the present invention, the switch operating means has operation feeling such as stroke feeling or click feeding, and excellent operating environment can be obtained.

The present invention is also directed to a display and input system having a display and input device having such switch operating means.

The present invention is further directed to a portable display and input device having such switch operating means, which is excellent in operability.

The remaining objects and features of the present invention are clarified in the following description.

BEST MODES FOR CARRYING OUT THE INVENTION

The present invention can be structured as various embodiments. The main mode thereof is a display and input device having switch operating means arranged on a peripheral edge portion of a display with a part overlapping on the display formed by a transparent member. Further, the present invention is also directed to a display and input device suitable for carrying having such switch operating means.

First Embodiment

Figure 1:
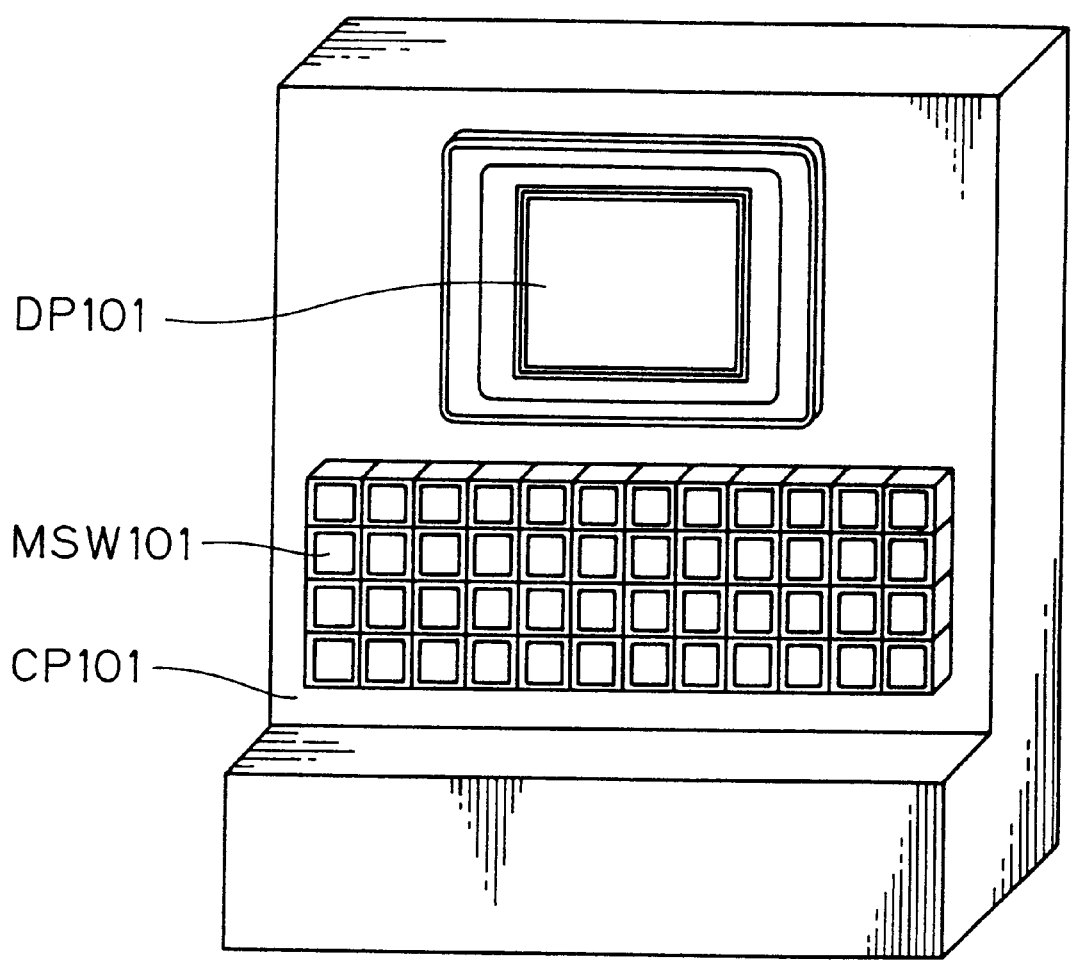
FIG. 1 to FIG. 3 are diagrams showing examples of conventional display and input devices.
Figure 2:
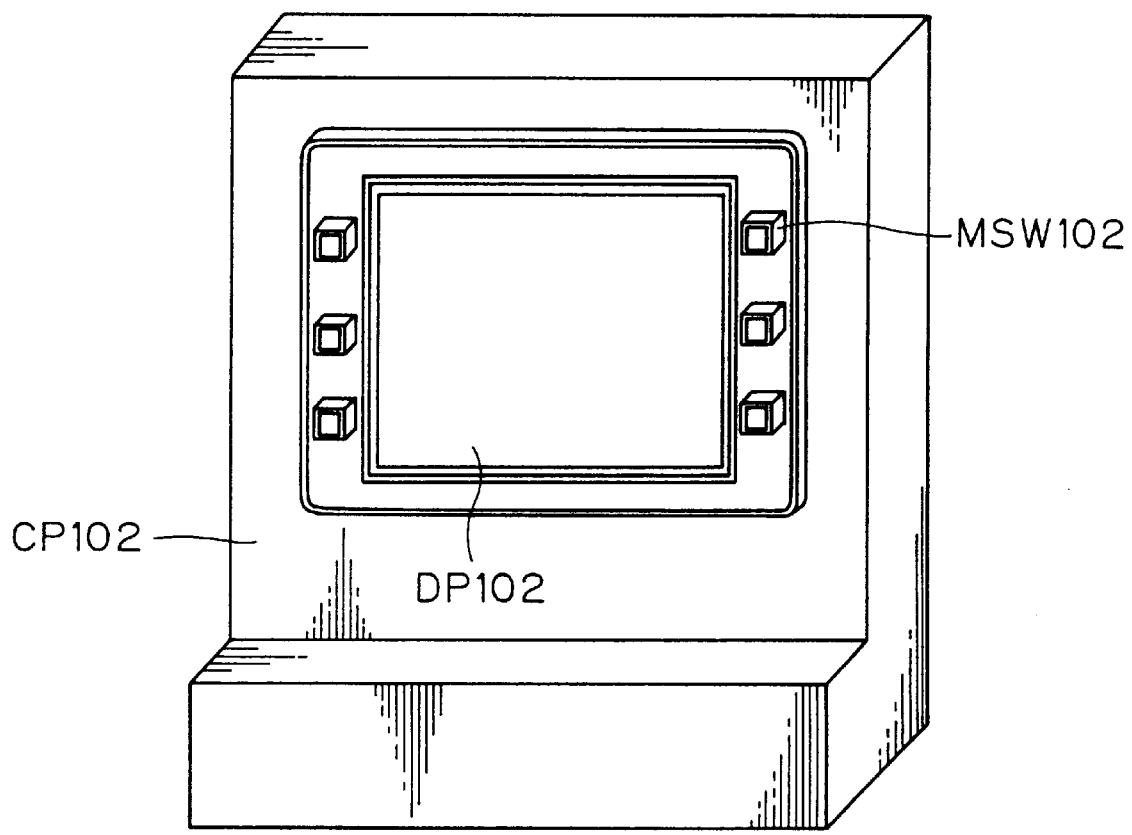
Figure 3:
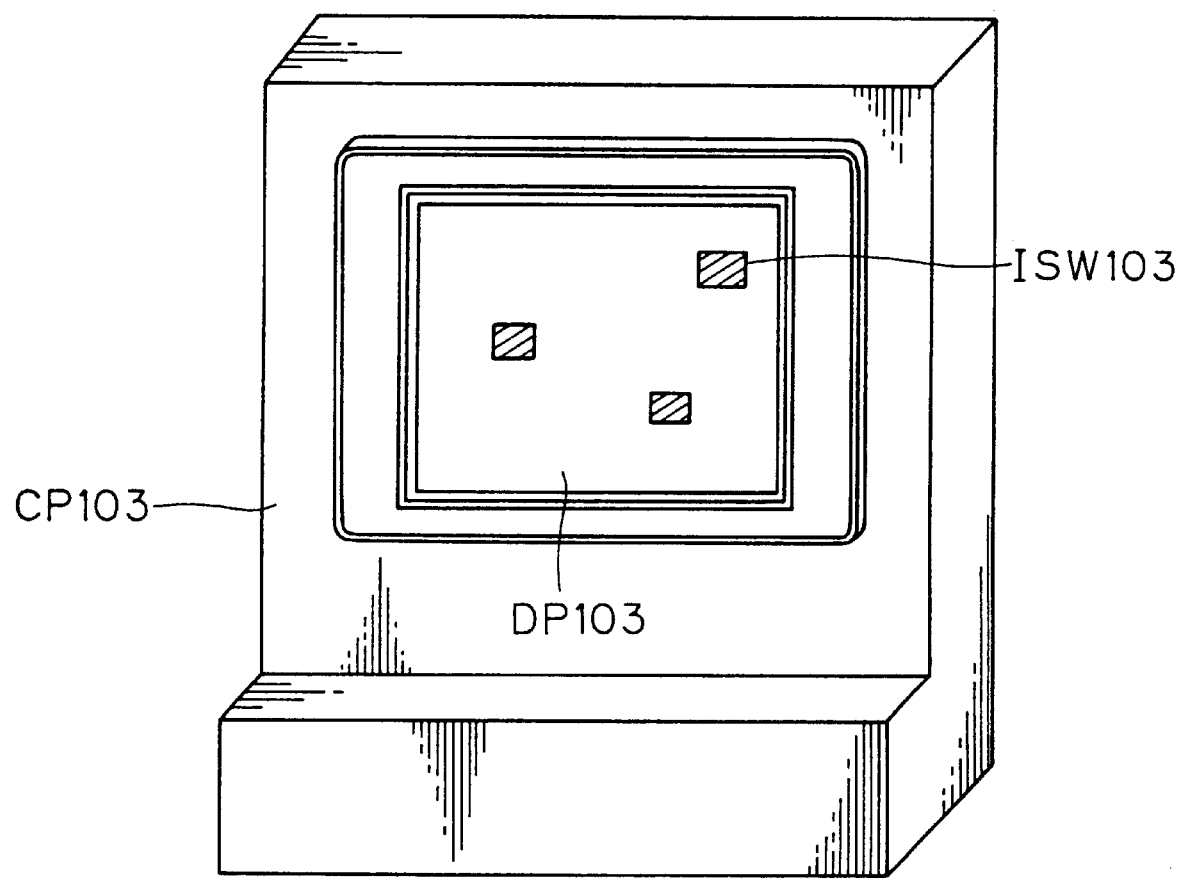
Figure 4:
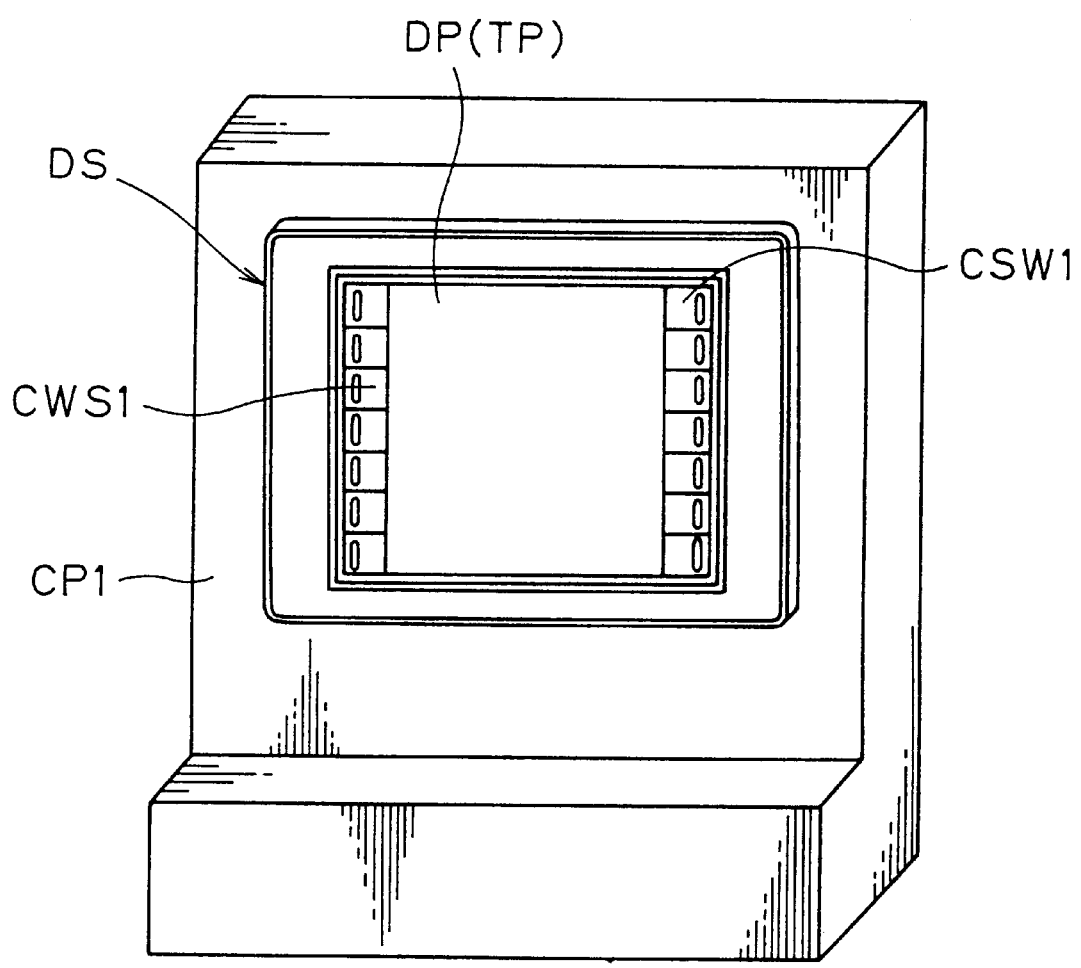
FIG. 4 is a perspective view showing a display and input device according to a first embodiment.
Figure 5:
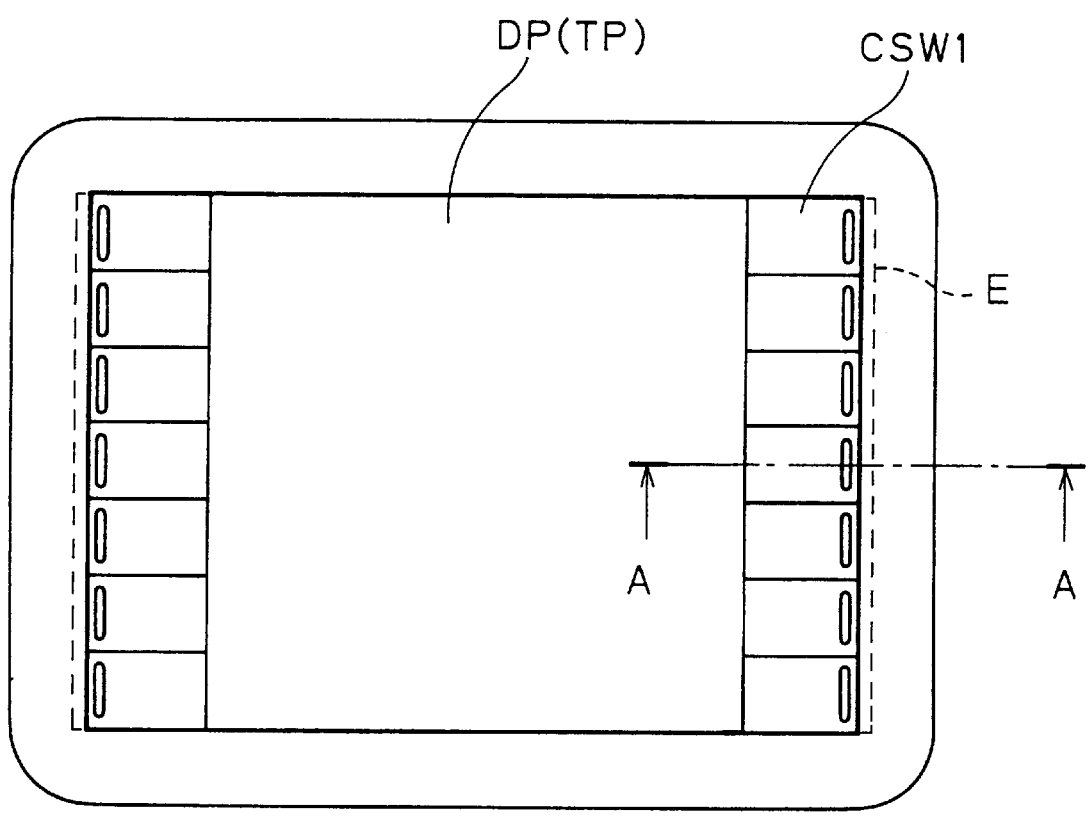
FIG. 5 is a diagram showing a display part.

FIG. 4 is a diagram showing an FA controller CP1 which is a first embodiment of the display and input device according to the present invention. This controller CP1 has transparent switch operating means CSW1 on a display DP formed by a liquid crystal display panel, so that information is selected by pushing this switch operating means FIG. 5 is a diagram showing a display part DS of this controller CP1. The transparent switch operating means CSW1 are plurally provided on left and right peripheral edge portions on the display DP as illustrated, and in members forming the switch operating means CSW1, all parts overlapping on the display DP are formed by transparent members. Further, opaque members inevitable as elements of the switch operating means CS1 are arranged to be hidden in areas E shown by broken lines outside the display DP. In the strict sense, the opaque members are not restricted to outside the display DP but arranged outside a displaying area on the display DP, while it is hereinafter simply referred to as outside the display DP for simplifying the description. Similarly, "on the display DP" stands for the displaying area on the display DP in the strict sense, while it is hereinafter simply referred to as "on the display DP".

Figure 6:
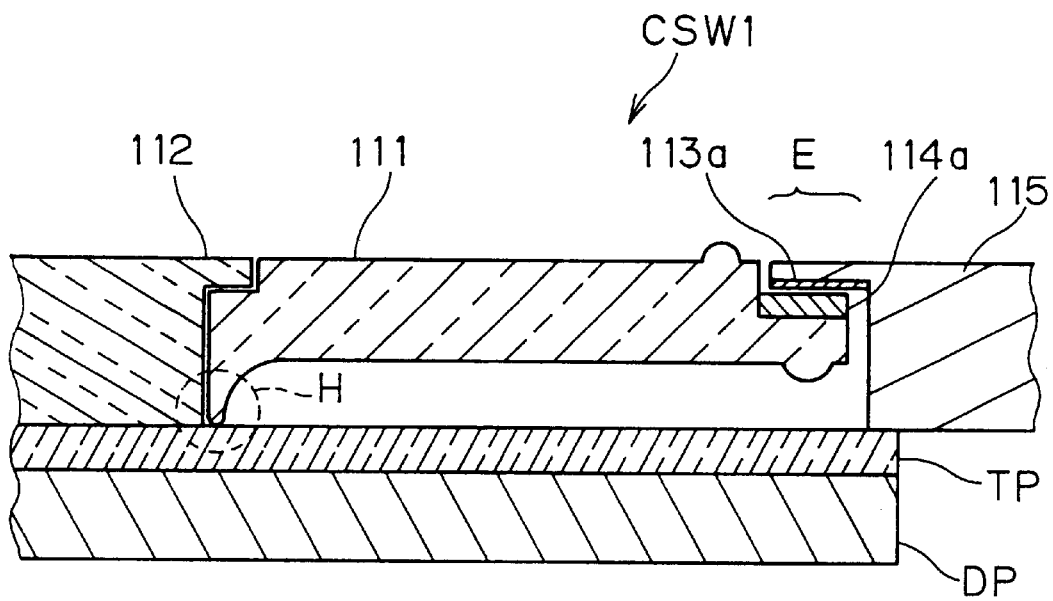
FIG. 6 and FIG. 7 are sectional views of switch operating means.
Figure 7:
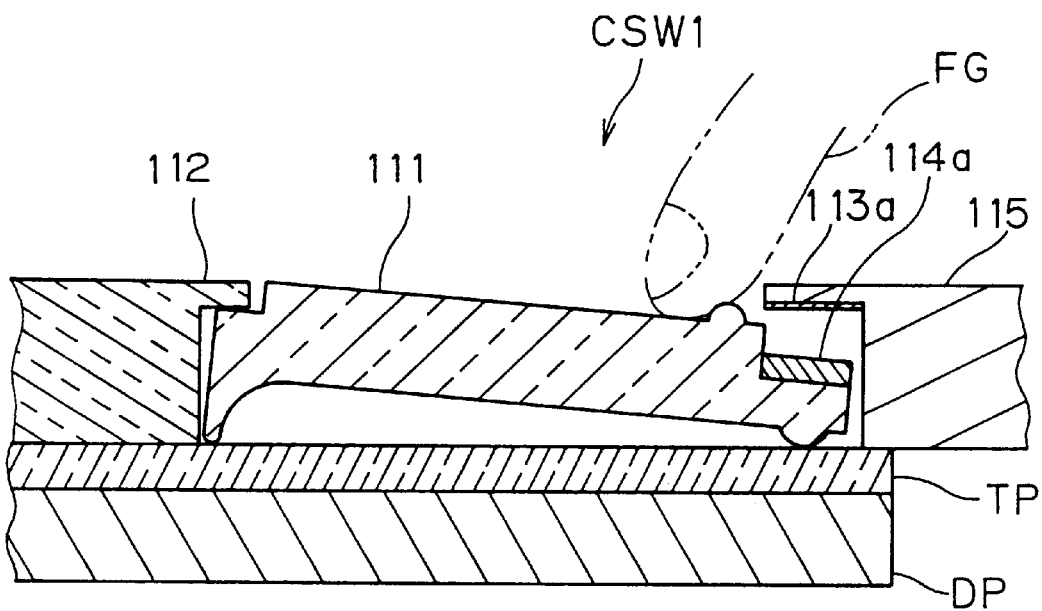

FIG. 6 and FIG. 7 are diagrams showing an A—A section in FIG. 5, FIG. 6 shows an unpushed state of the switch operating means CSW1, and FIG. 7 shows a state pushed by a finger FG. The switch operating means CSW1 is constructed on a surface of the display DP as illustrated, and has such an operating principle that a switch operating body 111 touches a touch switch TP provided on the display DP to be switched by being pressed down with the finger FG and displaced.

This switch operating means CSW1 is formed by the switch operating body 111 depressed with the finger, a transparent protective cover 112 and a casing 115 holding the switch operating body 111, the transparent touch switch TP provided on the display DP for generating a switching signal by touching the switch operating body 111, as well as a magnet 114a and a magnetic metal plate 113a utilizing mutual attraction as return force of the switch operating body 111. The protective cover 112 also fills the role of a bridge holding the switch operating body 111 at the side positioned closer to the center of the display DP for preventing coming-off.

These elements are not independently provided for every switch operating means CSW1 but a sharable one is provided as a single member for the plurality of switch operating means CSW1. For example, the touch switch TP is provided on the overall surface of the display DP, and employed in common for all switch operating means CSW1. Further, the casing 115 is also employed as a common member for all switch operating means CSW1. In addition, the magnetic metal plate 113a is employed as a common member for each of the left and right two groups of switch operating means shown in FIG. 5, and two are provided in the overall device.

A switching operation of this switch operating means CSW1 is now described. Generally in the switch operating means CSW1, the magnet 114a which is first magnetic means and the magnetic metal plate 113a which is second magnetic means are in contact with each other by magnetic attraction. Further, the magnet 114a is fixed to the switch operating body 111 and the magnetic metal plate 113a is fixed to the casing 115, whereby the switch operating body 111 is in a state raised about a hinge part H.

When pushing a side of the switch operating body 111 opposite to the hinge part H with the finger FG, it follows that the magnet 114a and the magnetic metal plate 113a having been in contact with each other by magnetic attraction to separate and the switch operating body 111 is depressed. The depressed switch operating body 111 comes into contact with the touch switch TP, so that the touch switch TP consequently detects the switching operation.

At this time, the user can obtain such snap action that the switch operating body 111 cannot be stopped on a halfway position if starting lowering or click feeling due to such action specific to the magnetic attraction that the magnetic attraction is large until the switch operating body 111 is pushed and starts to lower and the attraction abruptly reduces when the magnet 114a and the magnetic metal plate 113a separate to some extent, and excellent operation feeling can be obtained.

When detaching the finger pushing the switch operating body 111, the switch operating body 111 returns to the state of FIG. 6 due to the magnetic interaction of the magnet 114a and the magnetic metal plate 113a. Namely, the magnet 114a and the magnetic metal plate 113a form return means for the switch operating means CSW1 to automatically return.

While the operation of this switch operating means CSW1 is thus based on the operating principle of the touch switch TP, description is now made on the difference between the states of operations in the case of employing only the touch switch and in the case of providing the switch operating means CSW1 having the mechanism shown in FIG. 6 on the touch switch TP.

Figure 8:
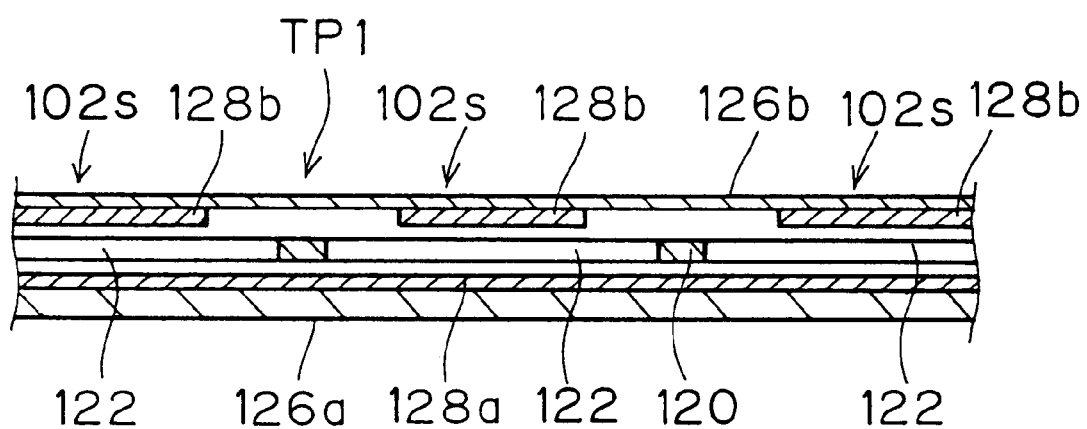
FIG. 8 is a sectional view of a resistor film touch switch.

While touch switches include those of various systems such as a resistor film type, a photoelectric type, an electrostatic capacitance type, an ultrasonic type and the like, every one of these touch switches has such a characteristic that input is performed by touching the same with a finger or a specific pen. FIG. 8 is a diagram illustrating a resistor film touch switch TP1 among these touch switches.

The touch switch TP1 has a mode overlapping a transparent thin plate 120 having a plurality of openings 122 on a transparent thin plate 126a formed with a transparent electrode 128a on its upper surface and further overlapping a transparent thin plate 126b formed with transparent electrodes 128b on its lower surface thereon. The transparent electrodes 128a and 128b may be a plurality of strip-like electrodes perpendicular to each other, or one of the electrodes, e.g., the transparent electrodes 128b may be a plurality electrodes while the other electrode, e.g., the transparent electrode 128a may be a common electrode.

A switch part 102s is formed on the portion of each opening 122, and when lightly pushing the portion of a desired opening 122 from the transparent thin plate 126b side in this example, the transparent electrode 128b is deflected due to flexibility of the transparent thin plate 126b and this transparent electrode 128b comes into contact with the lower transparent electrode 128a through the opening 122, to be electrically turned on. When stopping the operation of pushing the portion of the opening 122, the transparent thin plate 126b returns to the original shape and the switch part 102s is turned off.

Figure 9:
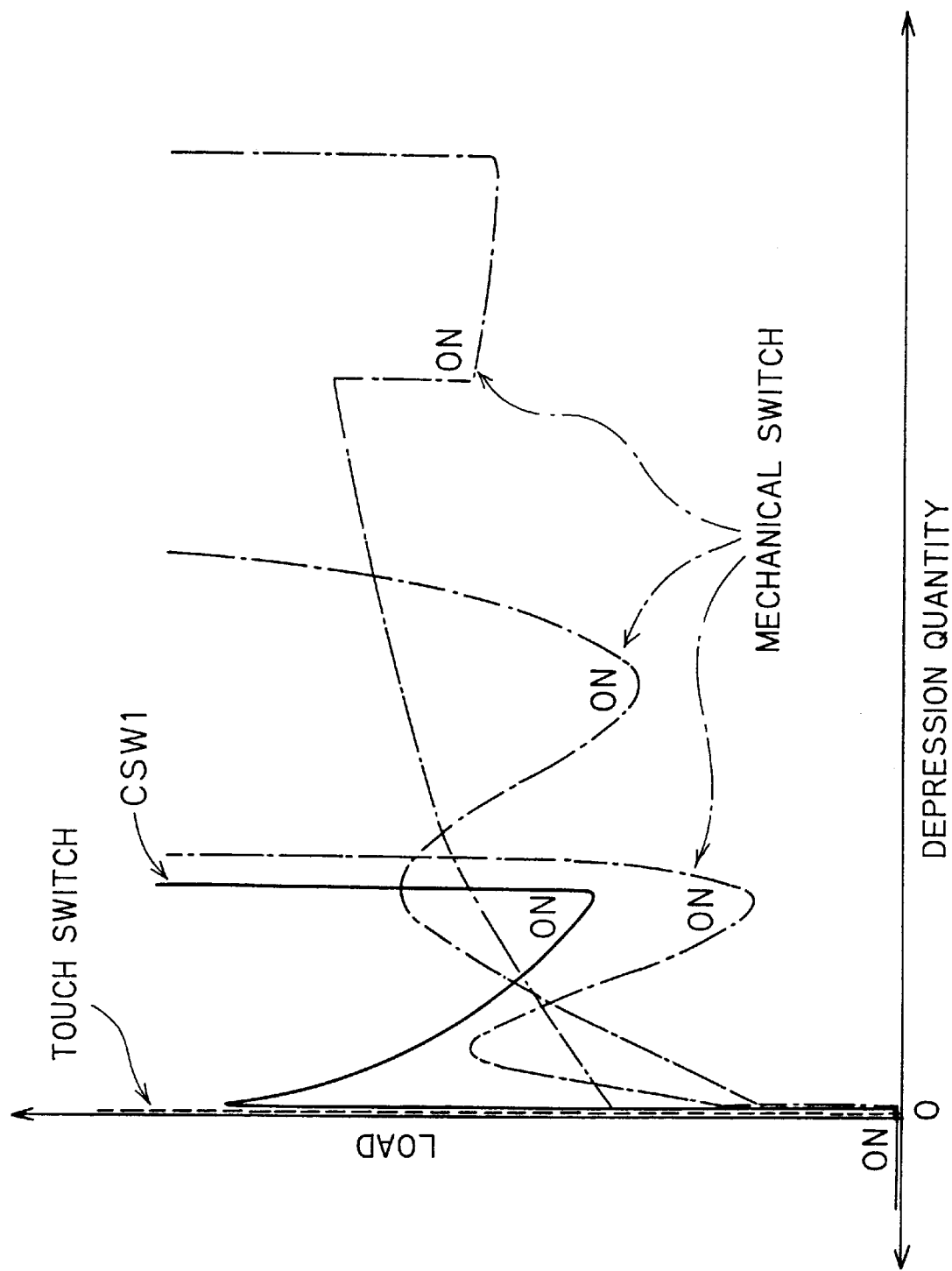
FIG. 9 is a depression quantity-load characteristic diagram of various types of switch operating means.

FIG. 9 compares the amount of movement characteristics of the touch switch having the aforementioned mechanism, the switch operating means CSW1 employing the magnets and a mechanical switch such as a tactile switch having a mechanical mechanism. As illustrated, the touch switch hardly has any amount of movement even if increasing the load, while the mechanical switch has any amount of movement and operation feeling (stroke feeling) which varies with 100% obtained. In the mechanical switch, further, such operation feeling (click feeling) is obtained that the load decreases when depressed to some extent while the load increases again when the amount of movement reaches the limit. On the other hand, the switch operating means CSW1 utilizing the magnets has a characteristic close to that of the mechanical switch, and operation feeling equivalent to that of the mechanical switch is obtained in stroke feeling as well as click feeling. Thus, the disadvantage of the touch switch lacking operation feeling can be overcome.

On the other hand, the touch switch has such an advantage that the same is transparent (light-transmittable) and can be provided on a display, while the representation on the display DP can be seen through the switch operating means CSW1 by employing transparent (translucent) materials for the switch operating body 111 and the protective cover 112 filling the role of a bridge also in the switch operating means CSW1. Namely, arrangement of the switch operating means CSW1 on the display DP is implemented by arranging the magnet 114a and the magnetic metal plate 113a which are opaque members in the areas E shown in FIG. 5 and FIG. 6. Consequently, the user can readily recognize and operate desired switch operating means CSW1 in accordance with the representation on the display DP. Further, while a screen may be stained through the touch switch since the screen is directly touched with a finger, such a problem can also be avoided by employing the switch operating means CSW1.

From the above, this switch operating means CSW1 implements arrangement of the switch operating means on the display, which is the advantage of the touch switch, while maintaining the stroke feeling and the click feeling which are the advantages of the mechanical switch.

While the structure, the operating principle and the operation features of this switch operating means CSW1 have been described above, a utilization mode of this switch operating means CSW1 is now described.

Figure 10:
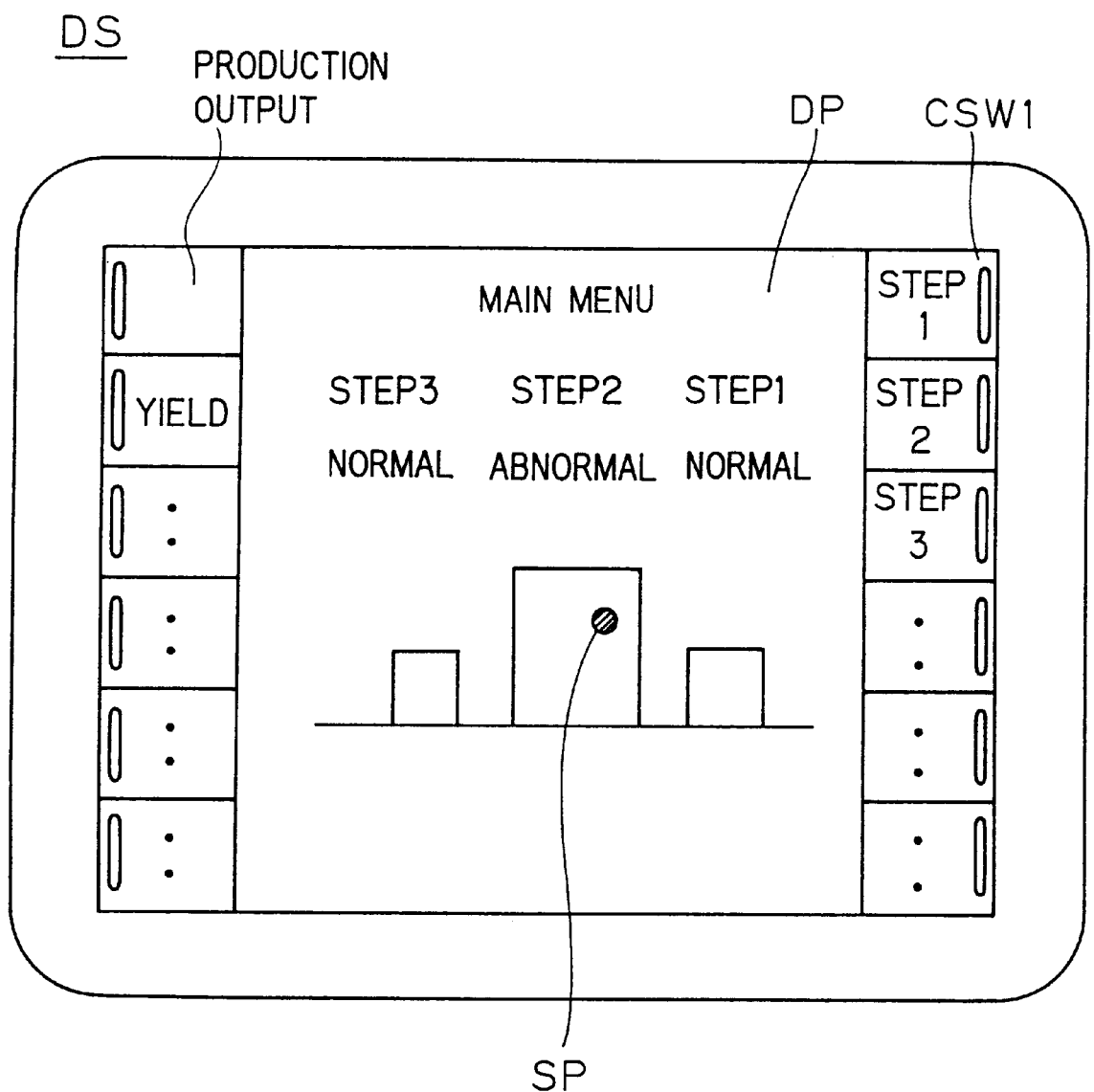
FIG. 10 and FIG. 11 are diagrams showing examples of representation on the display part.

FIG. 10 is a diagram showing an example of applying the FA controller CP1 to monitoring of a production process having steps 1, 2 and 3 and control of a robot. FIG. 10 shows a state of monitoring the overall general production process, and the display DP displays a menu of selectable information on the position of each switch operating means CSW1 so that the same seen through the switch operating body 111 of the switch operating means CSW1. By pushing each switch operating means CSW1, the content of the menu appearing on the position of the switch operating means CSW1 is displayed on the display DP.

FIG. 10 shows such a state that abnormality takes place in the step 2 and the portion of occurrence thereof is indicated by a spot SP. Here, the screen is switched as shown in FIG. 11 by pushing the switch operating means CSW1 on which the menu "step 2" is displayed.

Figure 11:
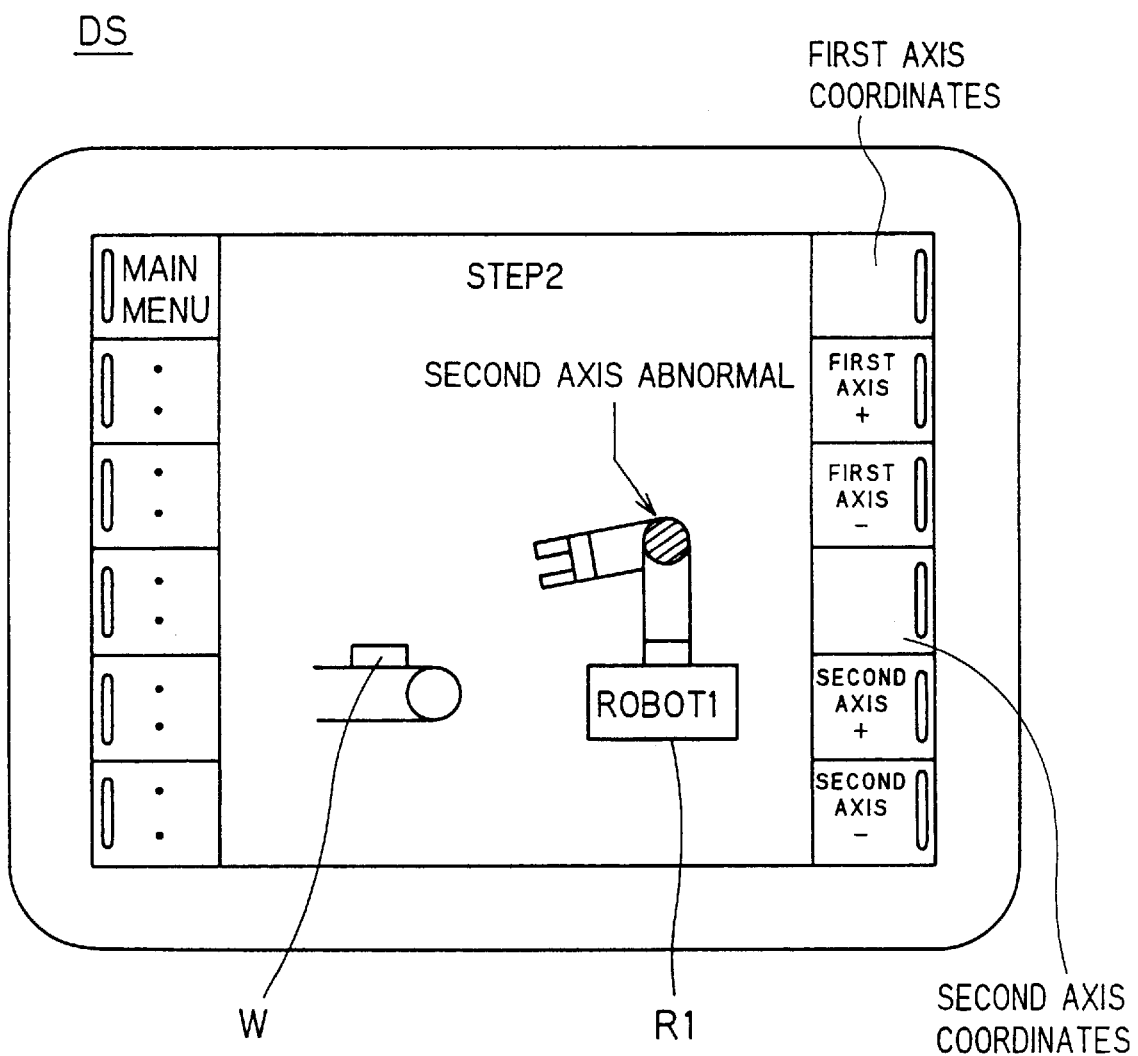

FIG. 11 is a diagram showing such a state that a displayed image indicating a robot R1 operating in the step 2 and a workpiece W is displayed on the display part DS. Existence of abnormality on a second axis of the robot R1 is displayed as illustrated, and a menu for representing the coordinates of each axis and a menu indicating input information moving each axis to a "+" direction or a "−" direction are displayed on each switch operating means CSW1, so that the displayed menus are executed by pushing these switch operating means CSW1.

Thus, this controller CP1 can let the display DP display the menus of the switch operating means CSW1 on rear surfaces of the switch operating means CSW1 for indicating the selectable information and information to be inputted which are the functions of the switch operating means CSW1, while change of the menus can also be readily performed by changing the representation on the display DP.

Figure 12:
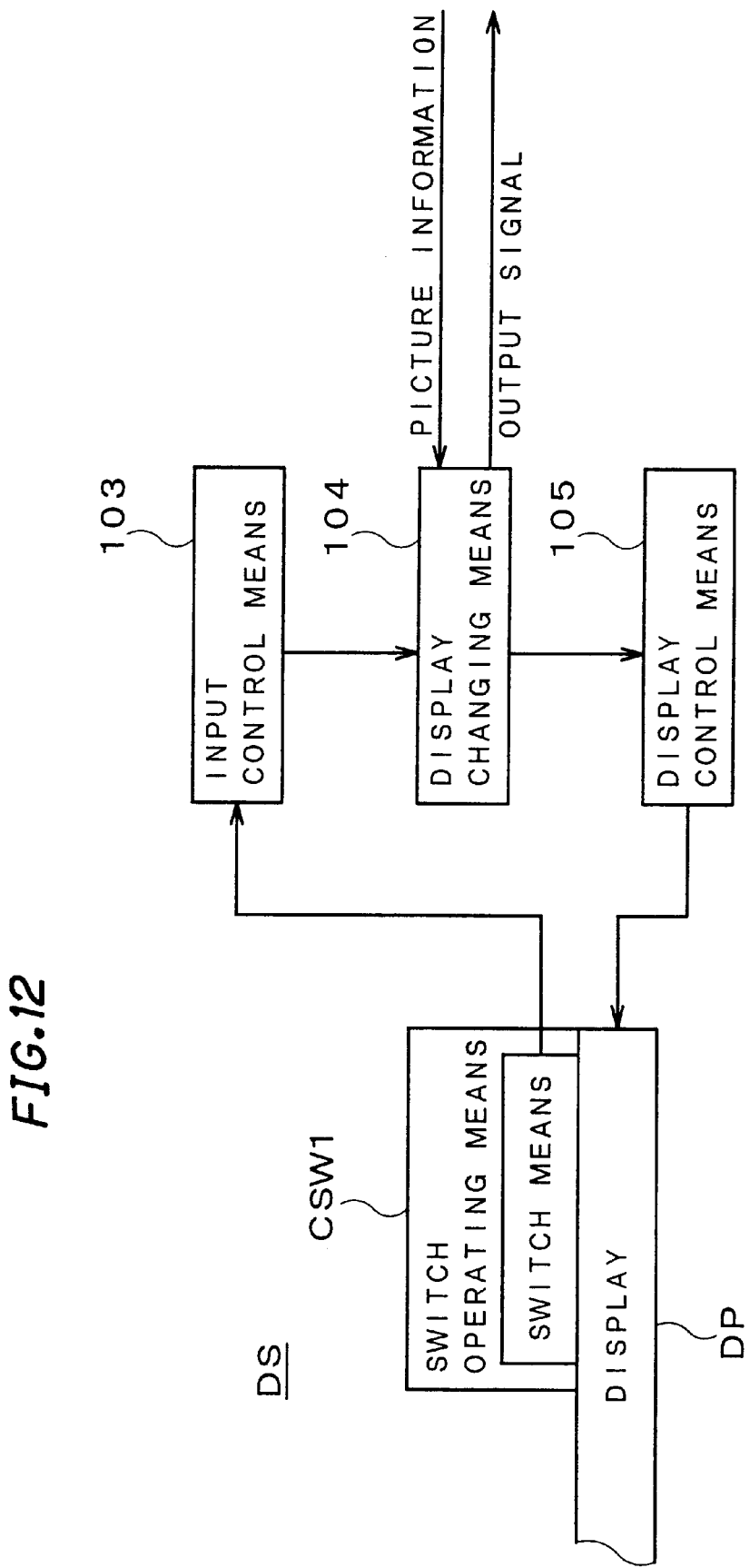
FIG. 12 is a block diagram of the display part.

FIG. 12 showing the mechanism in the display part DS for changing the menus which are the functions of this switch operating means CSW1. As shown in FIG. 12, the switch operating means CSW1 has the touch switch TP as switch means, and a signal from the switch means is inputted in input control means 103, to identify which switch operating means CSW1 has been pushed. The result of this identification is inputted in image changing means 104, so that the image changing means 104 causes the display DP to display the representation to be changed through display control means 105 on the basis of inputted picture information. At this time, the image changing means 104 comprehends what menus are displayed on which switch operating means CSW1 every time the representation is changed for enabling execution of proper image changing on the basis of the signal of the identification result of the switch operating means CSW1 from the input control means 103 while outputting an output signal to outside the display part DS if necessary. While the input control means 103, the image changing means 104 and the display control means 105 are included in the display part DS in FIG. 12, the same may be provided outside the display part DS, as a matter of course.

Figure 13:
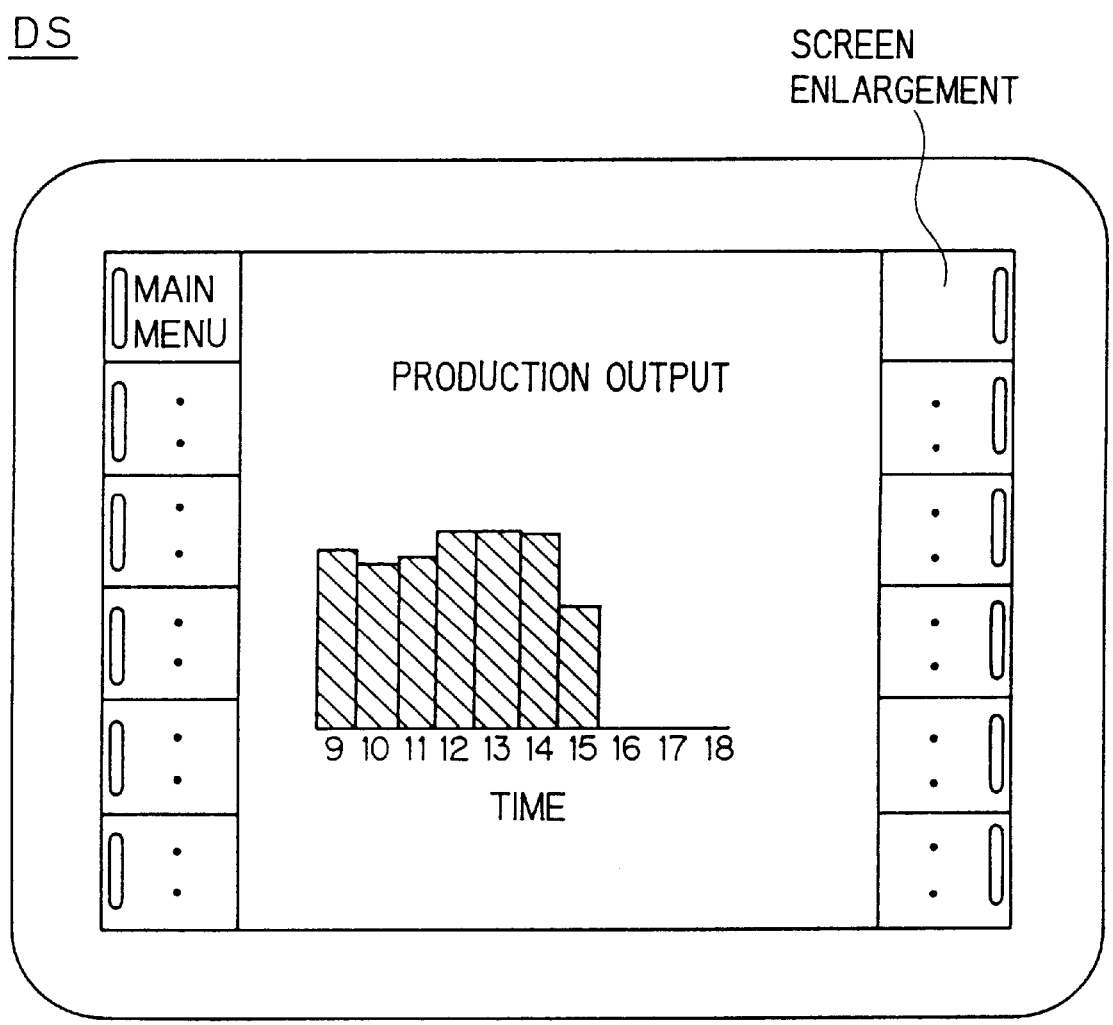
FIG. 13 and FIG. 14 are diagrams showing examples of representation on the display part.
Figure 14:
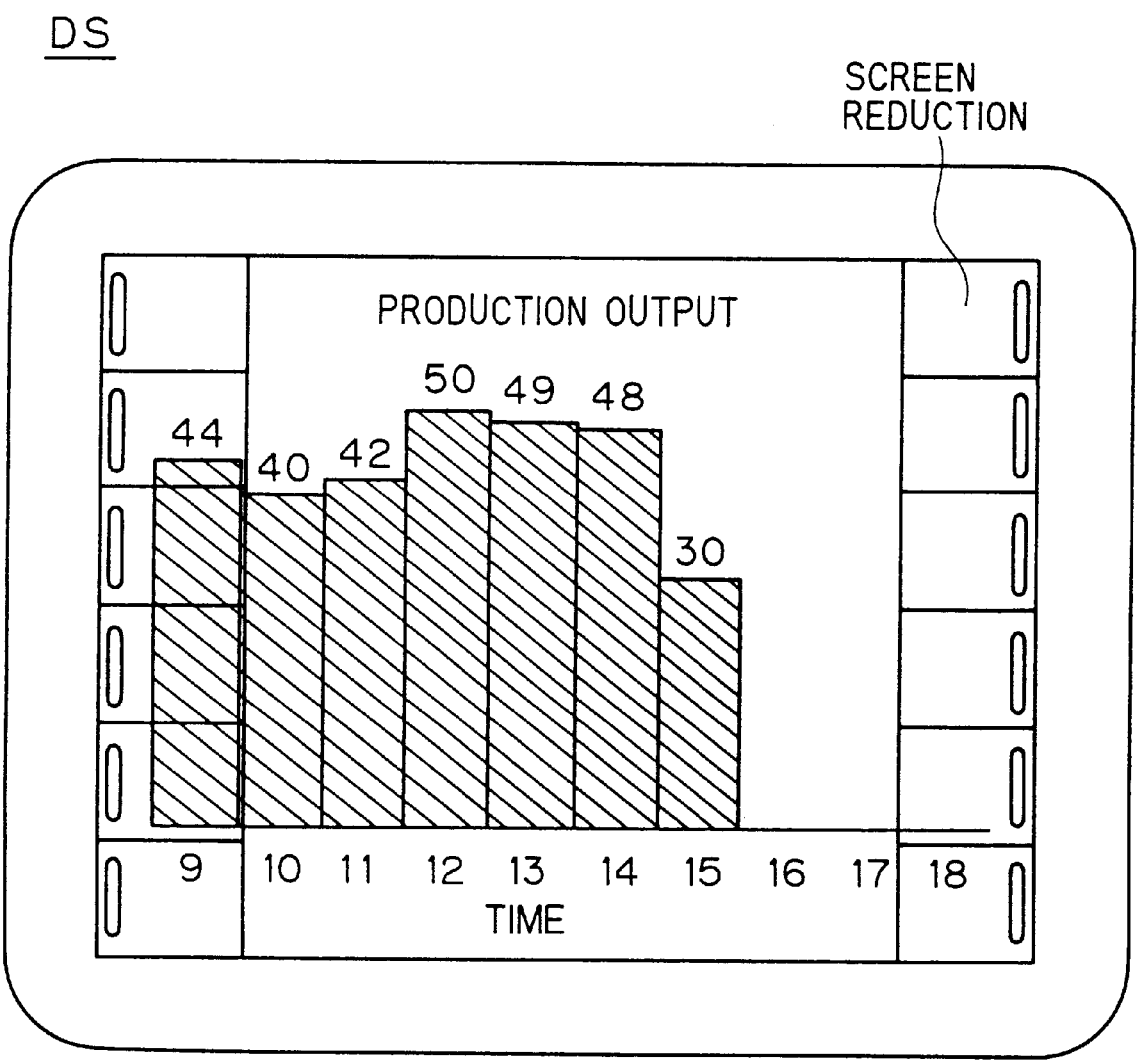

Since the switch operating means CSW1 is transparent in this display and input device, it is not inevitably necessary to let the switch operating means CSW1 display menus but instead the display may effectively utilize the overall screen without being influenced by the existence of the switch operating means CSW1 as shown in FIG. 14 by providing a menu of "screen enlargement" as shown in FIG. 13. Further, the magnitude of the representation may be automatically switched in response to the quantity of the displayed information.

In the display and input device according to this embodiment, as hereinabove described, no opaque members forming the switch operating means CSW1 exist on the display DP due to the arrangement of the switch operating means CSW1 on the edges of the display DP, it is also possible to display an image on the overall surface of the display DP including the switch operating means CSW1 while employing the switch operating means CSW1 as menus, and the screen can be effectively utilized.

Since the switch operating means CSW1 exist on the display DP, the user can readily recognize the association between the menus which are the representation of the switch operating means and the actual switch operating means CSW1 and may not perform a feeling operation, whereby erroneous input can be prevented.

Further, this switch operating means CSW1 utilizing the magnets can obtain operation feeling such as stroke feeling and click feeling similarly to the mechanical switch, and can obtain excellent operating environment.

Second Embodiment

Figure 15:
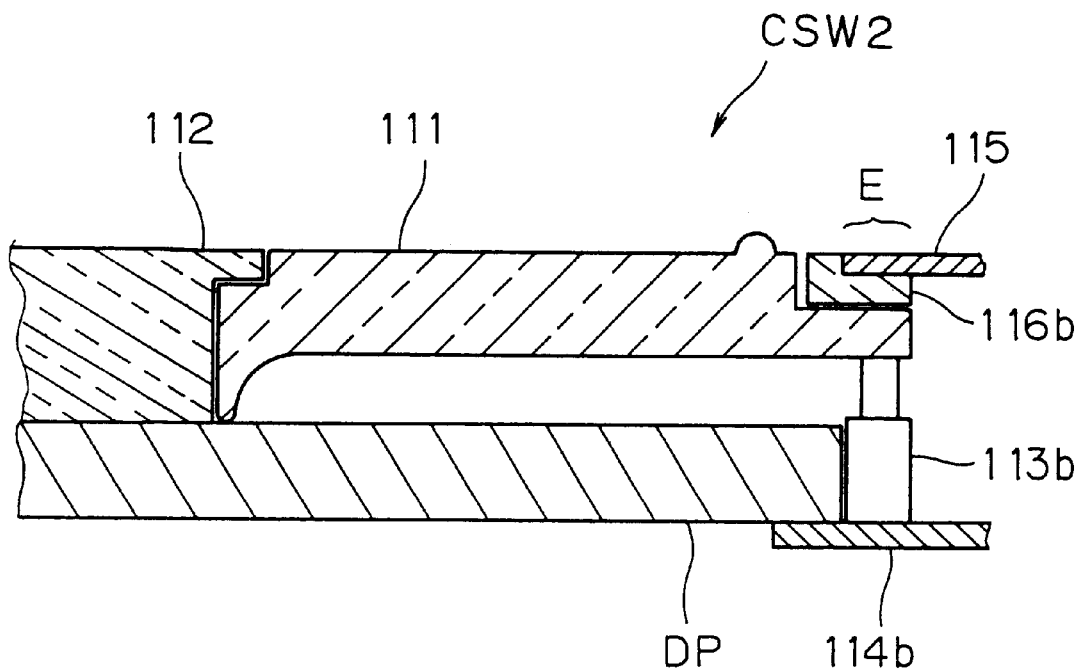
FIG. 15 and FIG. 16 are sectional views of switch operating means according to a second embodiment.
Figure 16:
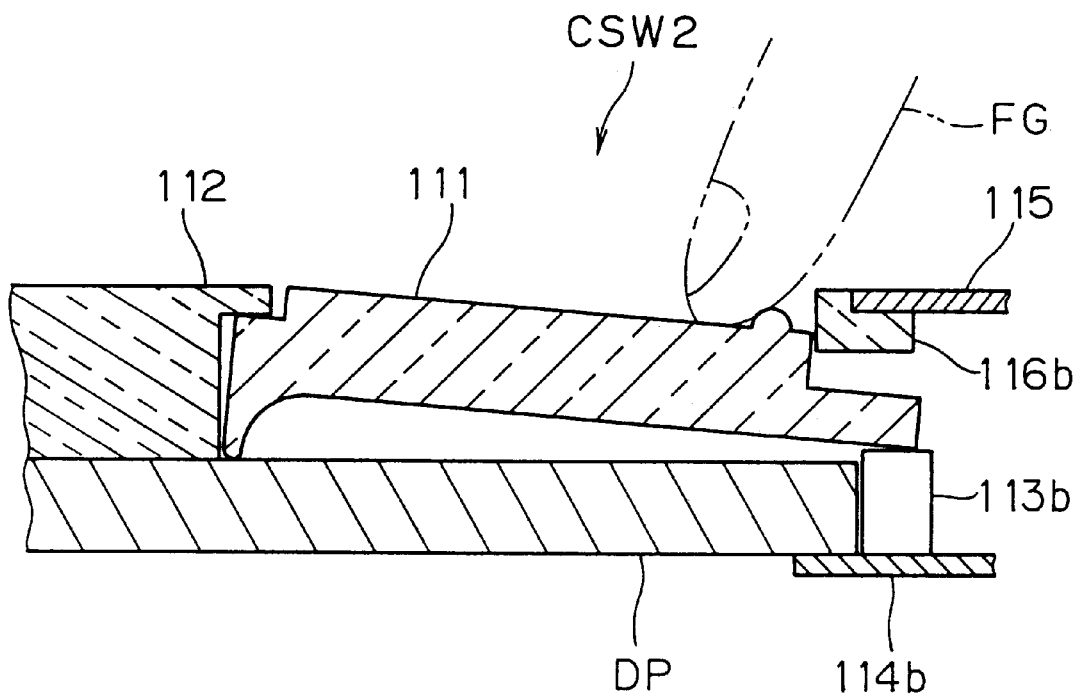

While the display and input device employing the switch operating means CSW1 utilizing the magnets has been described with reference to the first embodiment, this switch operating means may be that utilizing other than magnets. FIG. 15 and FIG. 16 are diagrams showing a section of switch operating means CSW2 utilizing an opaque mechanical switch 113b such as a tactile switch having a mechanical mechanism, and the appearance of the device is absolutely similar to that of the first embodiment shown in FIG. 4 and FIG. 5.

This switch operating means CSW2 is formed by a switch operating body 111 depressed with a finger FG, a transparent protective cover 112 and an engaging member 116b holding the switch operating body 111 and the mechanical switch 113b and is directly provided on a display DP formed by a liquid crystal display panel, and hence no touch switch TP is provided on the display DP dissimilarly to the first embodiment.

While the switch operating body 111 is held by the protective cover 112 and the casing 115 in the first embodiment, the engaging member 116b and a casing 115 may be rendered an integral member also in the switch operating means CSW2, as a matter of course. Similarly to the first embodiment, a portion of the protective cover 112 which is in contact with the switch operating body 111 also fills the role of a bridge holding the switch operating body 111 and preventing coming-off.

In an unloaded state, the switch operating body 111 is pushed up by the mechanical switch 113b to be in contact with the engaging member 116b, as shown in FIG. 15. When depressing the switch operating body 111 with the finger FG as shown in FIG. 16, the mechanical switch 113b is pushed and turned on, and this signal is outputted through a substrate 114b. When removing the load by detaching the finger FG from the switch operating means CSW2, the switch operating body 111 returns to the state of FIG. 15 due to restoring force of the mechanical switch 113b and the output is off. Namely, the mechanical switch 113b serves as return means for the switch operating means CSW2.

Also in this switch operating means CSW2, the switch operating body 111 and the protective cover 112 are made of transparent materials, similarly to the switch operating means CSW1 in the first embodiment. The mechanical switch 113b which is opaque switch means is provided under the area E shown in FIG. 5, so that no opaque member exists on the display DP.

Similarly to the first embodiment, therefore, display of the display DP can be seen through the switch operating means CSW2, and a screen can be effectively utilized. Further, the screen is not stained since the finger does not directly touch the display DP. In addition, the mechanical switch 113b is a switch capable of obtaining stroke feeling and click feeling as shown in FIG. 9 and hence the switch operating means CSW2 also sufficiently has operation feeling. Further, the mechanical switch is low-priced as compared with the touch switch, and cost reduction can also be implemented.

Figure 17:
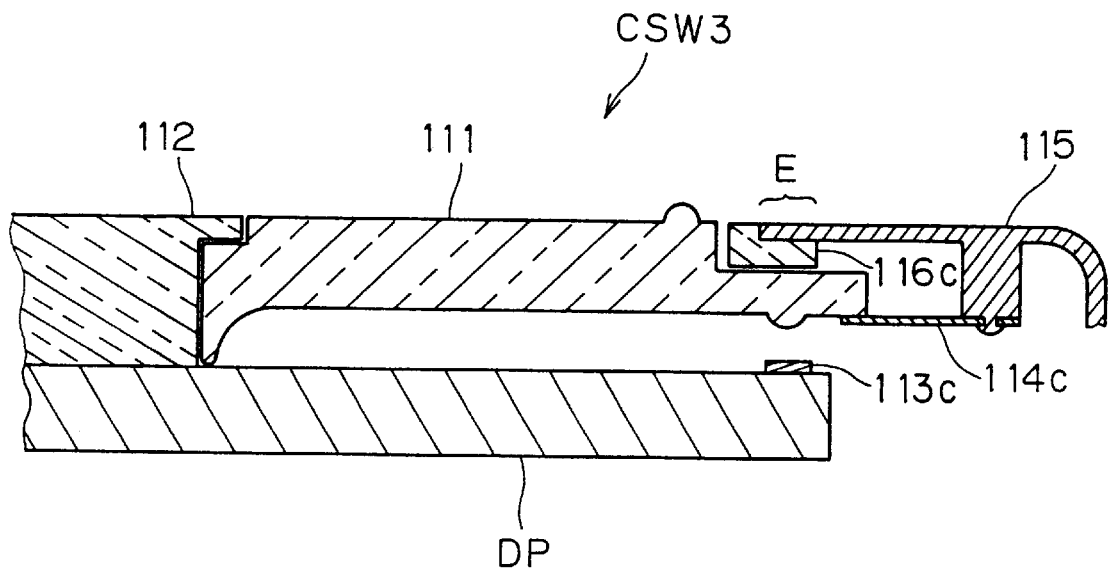
FIG. 17 and FIG. 18 are sectional views of another switch operating means.
Figure 18:
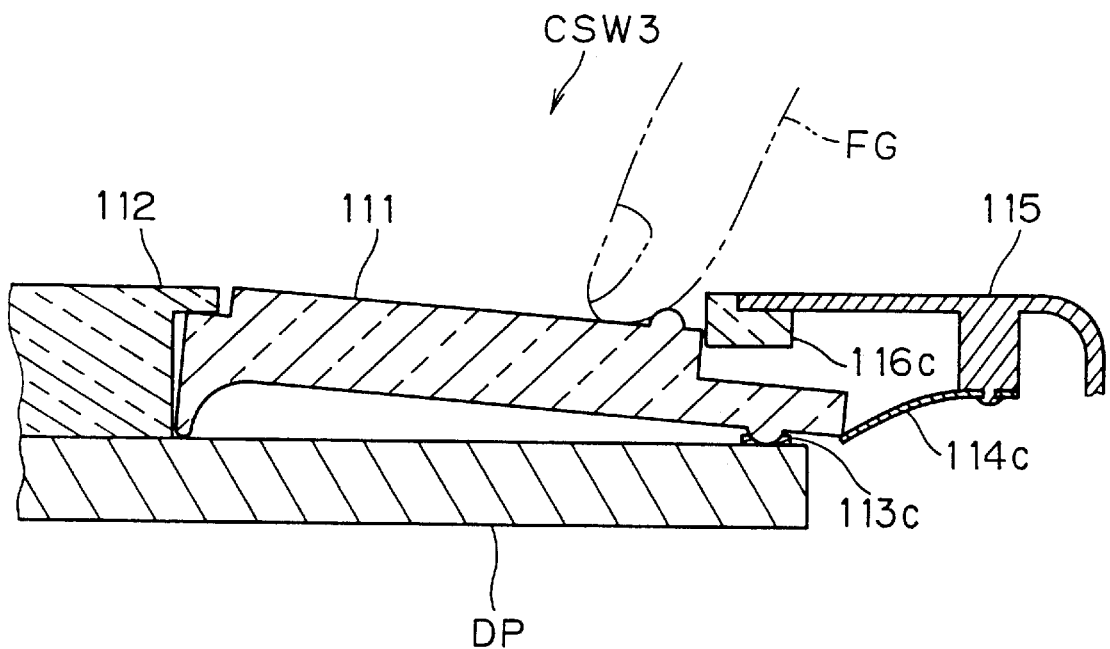

As shown in FIG. 17 and FIG. 18, it is also possible to form switch operating means CSW3 by employing a plate spring 114c and a membrane switch 113c switched on by pressurization without employing the mechanical switch.

In this switch operating means CSW3, a switch operating body 111 returns through restoring force of the plate spring 114c, and switching utilizes such a principle that the switch operating body 111 comes into contact with the membrane switch 113c.

Stroke feeling can be sufficiently obtained also in this case, and operation feeling can be sufficiently obtained as compared with the touch switch. Further, it has such advantages that the mechanism is simple and that the same is low-priced.

As described above, a display and input device providing transparent switch operating means on the edges of the display DP can also be implemented by employing a switch having a mechanical mechanism, a plate spring and the like, and in this case, a clear screen can be implemented with no member covering the display dissimilarly to the resistor film touch switch.

Third Embodiment

Figure 19:
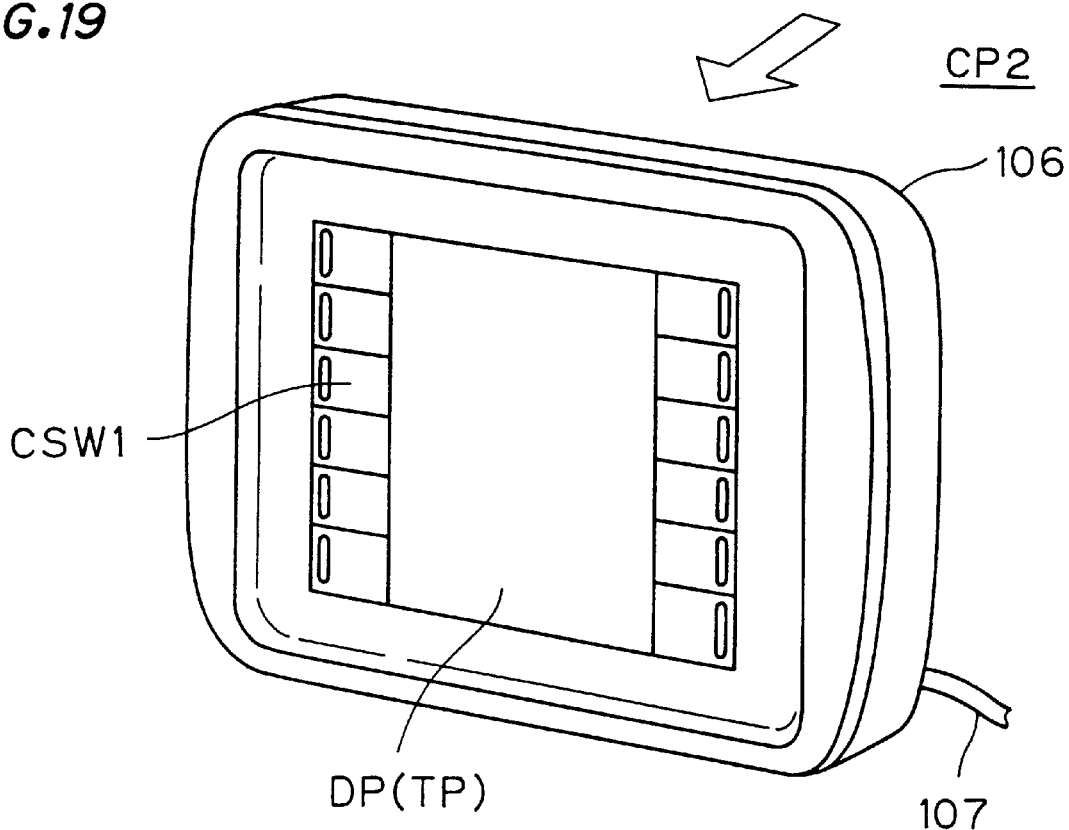
FIG. 19 and FIG. 20 are perspective views showing a portable display and input device according to a third embodiment.
Figure 20:
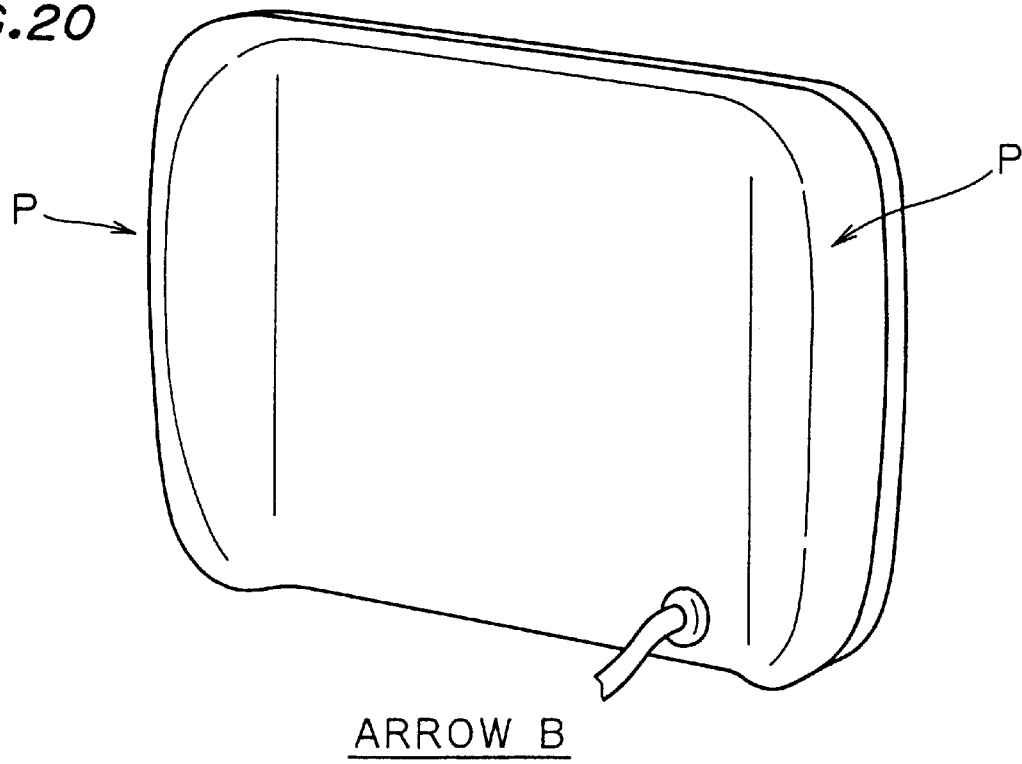

FIG. 19 and FIG. 20 are appearance diagrams showing a portable display and input terminal CP2 which is a third embodiment according to the display and input device of the present invention. FIG. 19 is a perspective view as viewed from a display DP side, and FIG. 20 is a perspective view of a rear surface as viewed from arrow B in FIG. 19.

In a display part DS of this display and input terminal CP2, a resistor film touch switch TP is provided on a display DP formed by a liquid crystal display panel similarly to the first embodiment, and switch operating means CSW1 utilizing magnets are provided on left and right edges on the display DP. The remaining elements such as the input control means 103, the image changing means 104, the display control means 105 and the like shown in FIG. 12 may be stored in a cover 106, or may be provided outside the terminal CP2.

Figure 21:
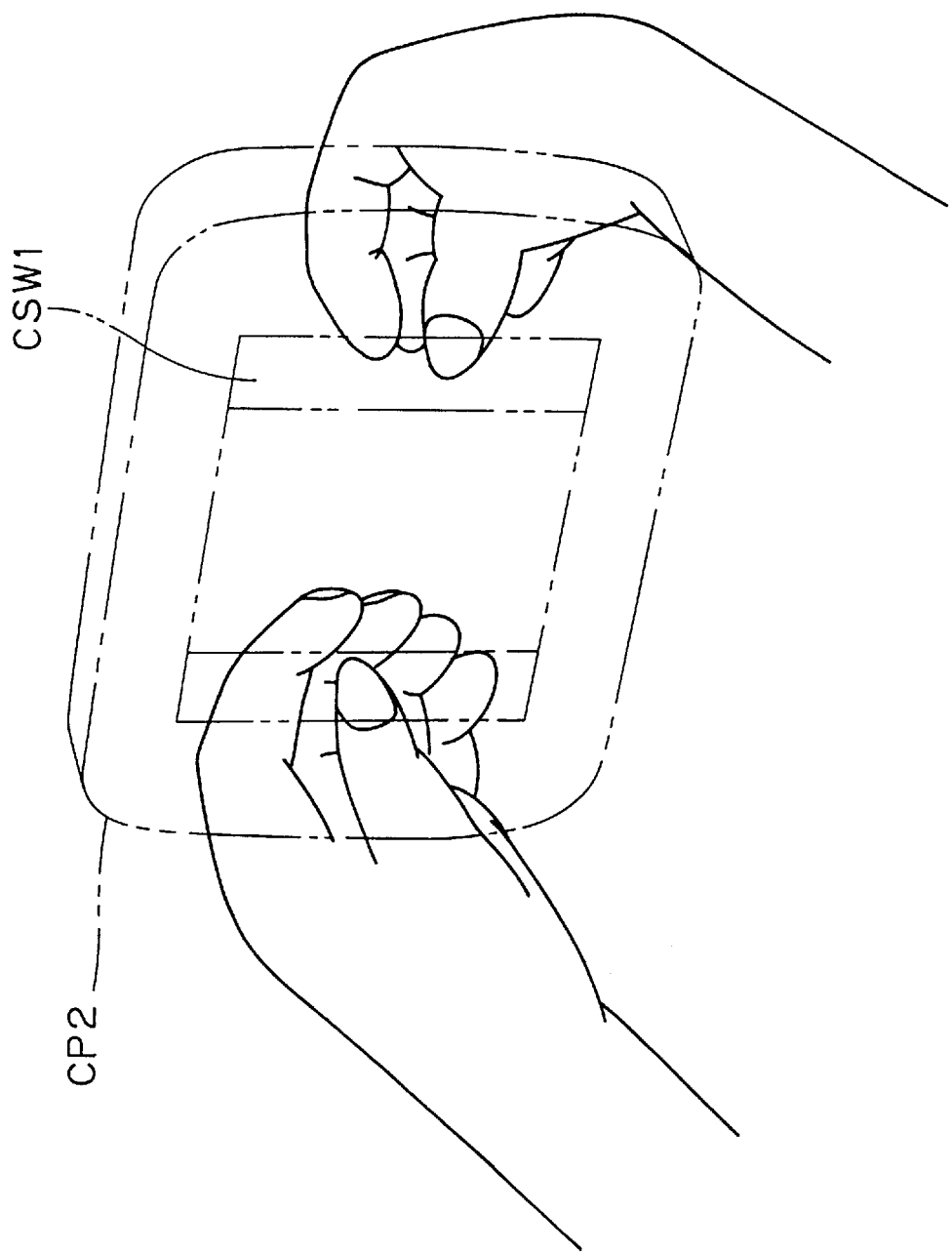
FIG. 21 is a diagram showing a method of grasping the display and input device according to the third embodiment.

In the case of such a display and input device having portability, such excellent operating environment is implemented that an input operation can be performed with the thumbs while grasping the terminal CP2 with both hands as shown in FIG. 21, due to arrangement of the switch operating means CSW1 on the left and right sides on the display DP. Further, this display and input terminal CP2 is provided with projections P on the left and right sides of its rear surface, and input can be performed while the fingers other than the thumbs tightly grasp the terminal body, so that a further stable input operation can be performed.

Since a display part DS of the display and input terminal CP2 has a structure similar to that of the first embodiment, the display can be effectively utilized up to the areas of the switch operating means CSW1. Further, since the fingers do not directly touch the display DP, stain of a screen can also be prevented. In addition, the association between display and the switch operating means can be readily comprehended and operation feeling of stroke feeling and click feeling can be obtained, whereby an erroneous operation can be prevented and a reliable input operation can be performed.

Fourth Embodiment

Figure 22:
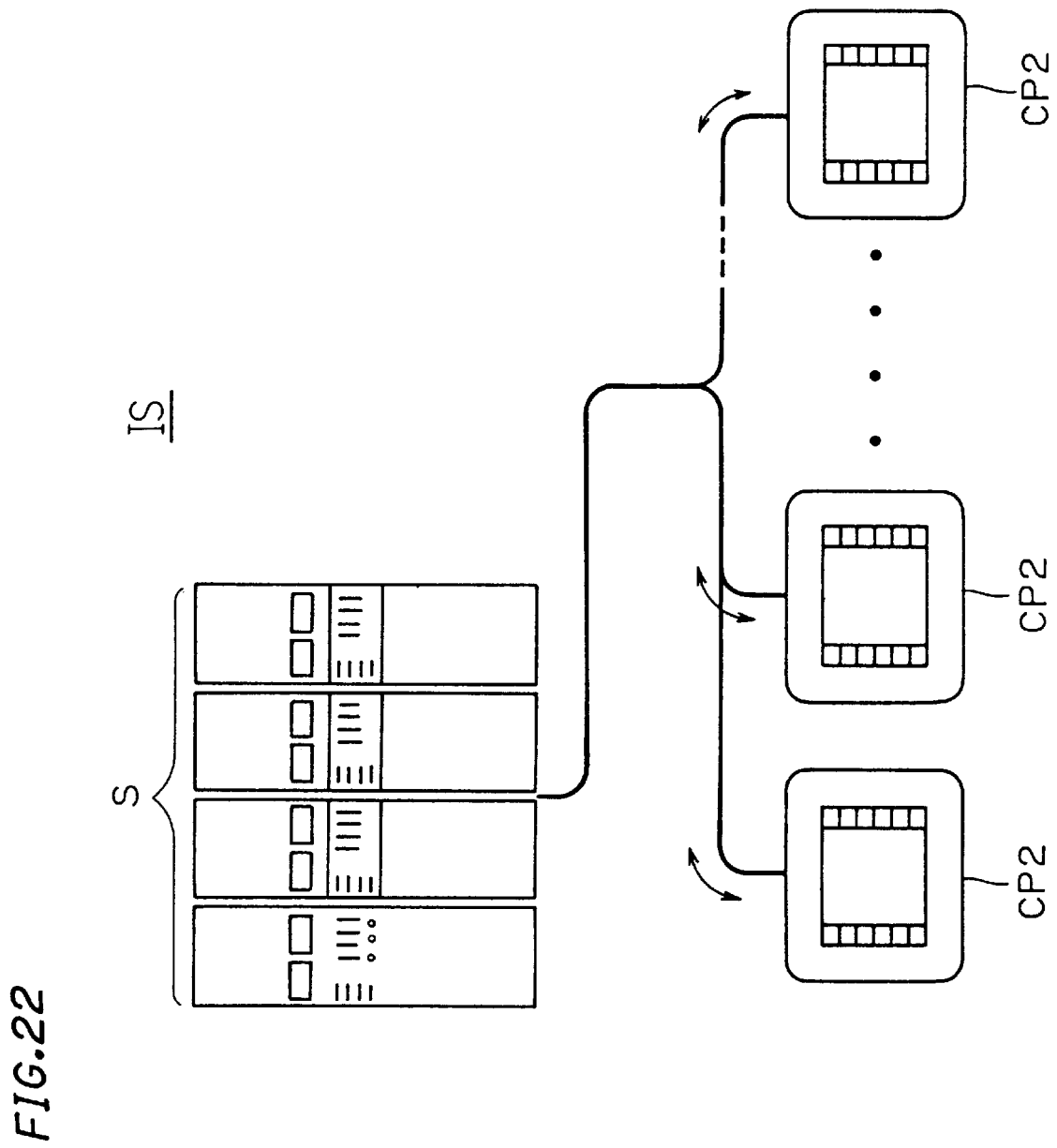
FIG. 22 is a diagram showing a display and input system according to a fourth embodiment.

FIG. 22 is a diagram showing a display and input system IS formed by plurally employing the display and input terminals CP2 in the third embodiment.

A server S which is a main information processing device shown in FIG. 22 supplies desired information to each terminal CP2 in response to a signal inputted from each terminal CP2. The information supply mode at this time may be a mode of supplying common information to all terminals CP2 so that each terminal CP2 selects the information, or a mode of supplying information from the server S to a specific terminal CP2. Further, information inputted from one terminal CP2 may be supplied to another terminal CP2 through the server S.

By constructing such a display and input system IS, acquisition of common information or bidirectional communication between the respective terminals CP2 is enabled under excellent operating environment.

Fifth Embodiment

Figure 23:
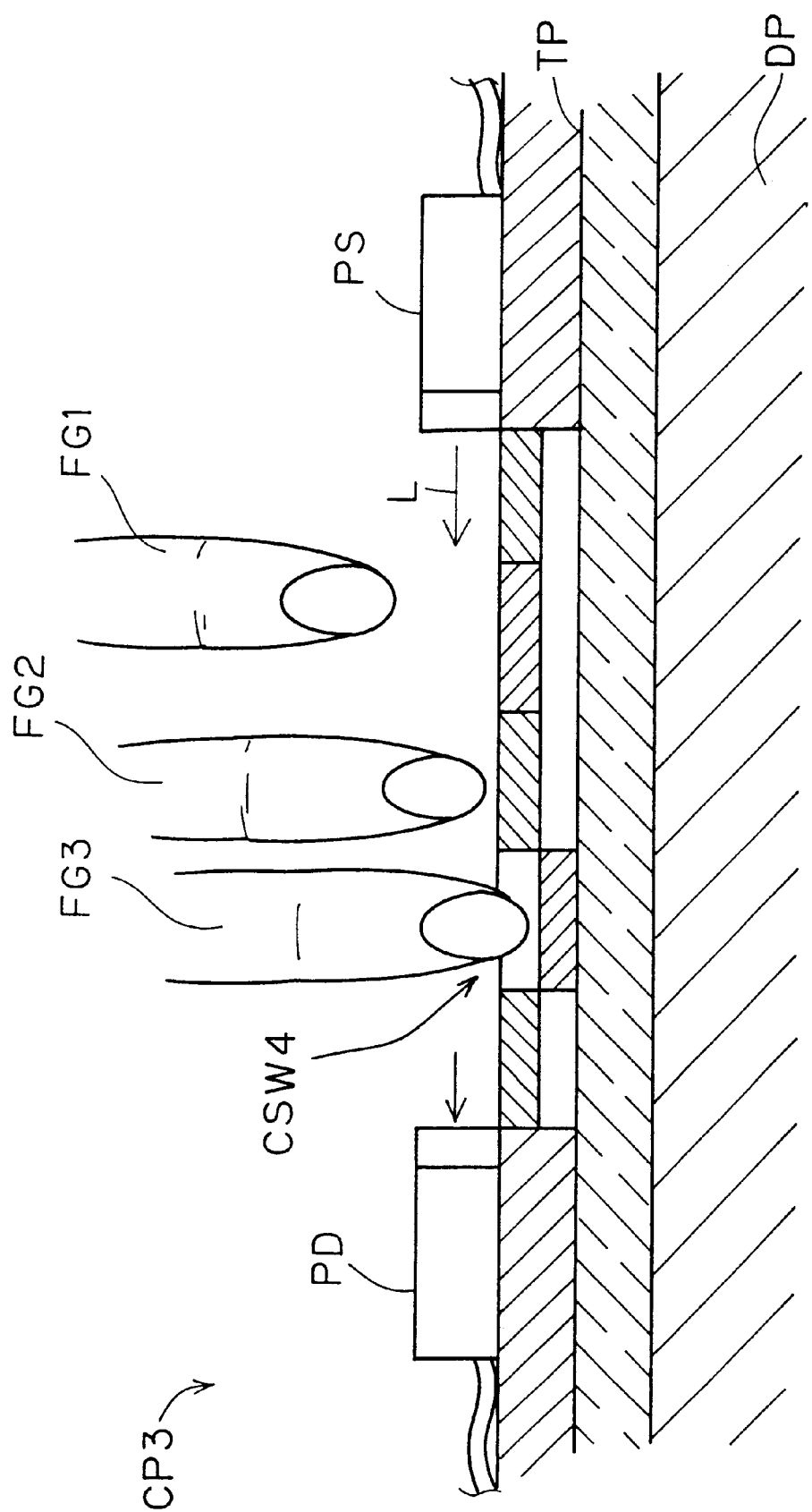
FIG. 23 is a longitudinal sectional view of a display of a display and input device according to a fifth embodiment.

FIG. 23 is a diagram showing a section through a display DP of a display and input device CP3 according to a fifth embodiment of the present invention. In this device CP3, a light emitting device PS and a photodetector PD are provided on a touch switch TP, and transparent key operating means CSW4 touching the touch switch TP by being pushed with a finger is provided between the light emitting device PS and the photodetector PD. The key operating means CSW4 is in a structure similar to the first embodiment, and the display and input device CP3 is utilized independently or as a terminal of a system similarly to the first embodiment or the fourth embodiment.

In the display and input device CP3, light L emitted from the light emitting device PS enters the photodetector PD when separated from the display DP as a finger FG1, while, when trying to touch the key operating means CSW4, the light L is shaded by a finger FG2, detects an operation for key selection/specification displayed on the display DP and is transmitted to the input control means 103 shown in FIG. 12 before touching the key operating means CSW4 as a finger FG3.

Figure 24:
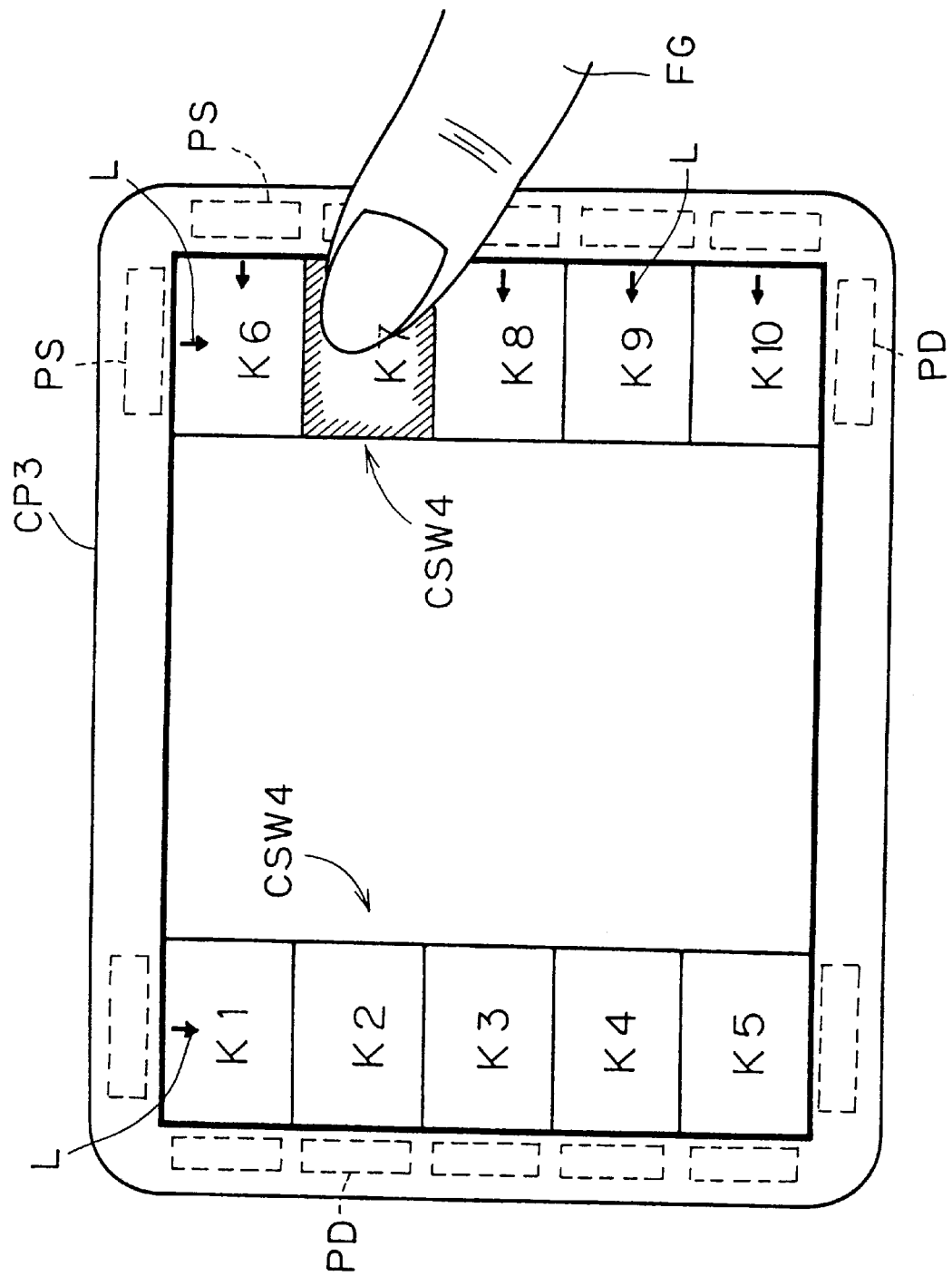
FIG. 24 is a front elevational view of the display and input device according to the fifth embodiment.

FIG. 24 is a diagram showing arrangement of light emitting devices PS and photodetectors PD. As illustrated, the light emitting devices PS are arranged on the upper side and the right side of the display DP while the photodetectors DP are arranged on the lower side and the left side opposite through the display DP. The light L emitted from the light emitting devices PS is received by the opposite photodetectors PD, while, when trying to touch a key K7 displayed on the display DP as shown at a finger FG in FIG. 24, for example, the light L passing through the position of the key K7 is shaded in the light L transmitted in the upper, lower, left and right directions, to detect that the finger FG is going to touch the key K7.

In the display and input device CP3, the input control means 103 transmits a signal to display control means 105 on the basis of the result of this detection, so that confirmation of the key to be selected/specified can be made by flickering the key K7, changing the display color or performing display of characters or an image. The confirmation of the key is not restricted to change of the displayed image, but the input control means 103 may control a speaker provided on the display and input device CP3 for confirming the key through a voice guide, for example. Namely, any method is employable so far as the key to be operated by the operator is recognizable.

Thus in the display and input device CP3, the light emitting device PS and the photodetector PD preliminarily select/specify the key in a first stage before the finger FG actually touches the key so that the position of existence can be confirmed by changing the display of the key K to be selected/specified. In this case, selection/specification can also be made while tracing the key operating means CSW4. A press operation of a second stage is performed as to the key subjected to such change of the display mode, whereby the selection/specification is settled. Consequently, erroneous input can be prevented.

Modifications of First to Fifth Embodiments

While the first to fifth embodiments of the display and input device according to the present invention have been described above, the present invention is not restricted to the aforementioned embodiments but the following modifications are also available:

While the first to fifth embodiments employ a liquid crystal display as the display DP, a plasma display, an EL display, a CRT display or the like may be employable.

Figure 25:
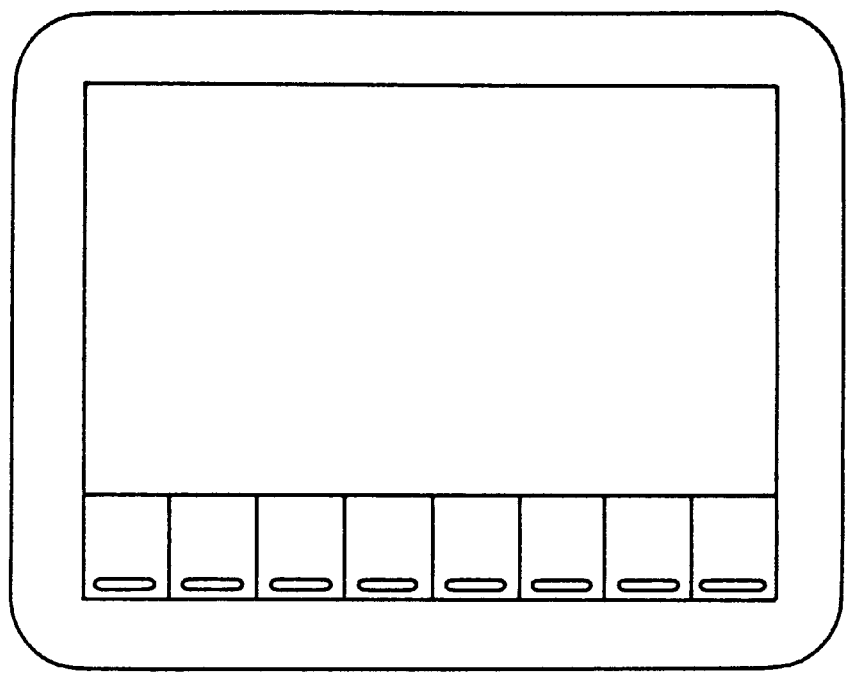
FIG. 25 and FIG. 26 are diagrams showing arrangement of switch operating means.
Figure 26:
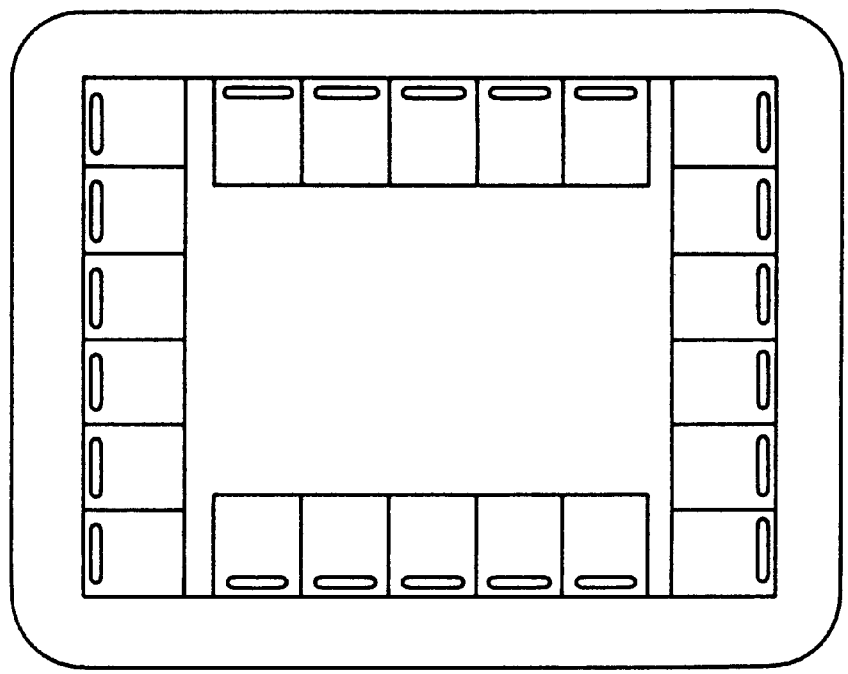

While the switch operating means are arranged on the left and right edges of the display DP in these embodiments, the same may be arranged on arbitrary positions if arranged on edges of the display, and may be arranged only on a lower portion of a screen as shown in FIG. 25, or may be arranged on upper, lower, left and right portions as shown in FIG. 26, for example.

While the resistor film touch switch TP is provided on the display DP in the first and third to fifth embodiments, an electrostatic capacitance type, photoelectric type, ultrasonic type touch switch or the like may be employable. The switch operating body 111 may not necessarily be displaced to touch the touch switch such as a photoelectric touch switch.

Figure 27:
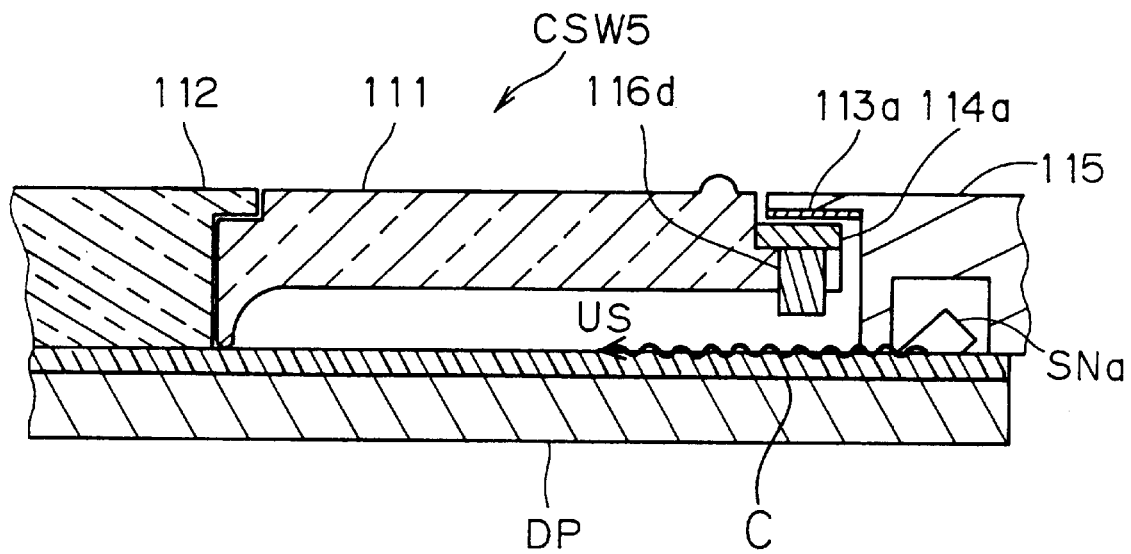
FIG. 27 and FIG. 28 are sectional views of the switch operating means.
Figure 28:
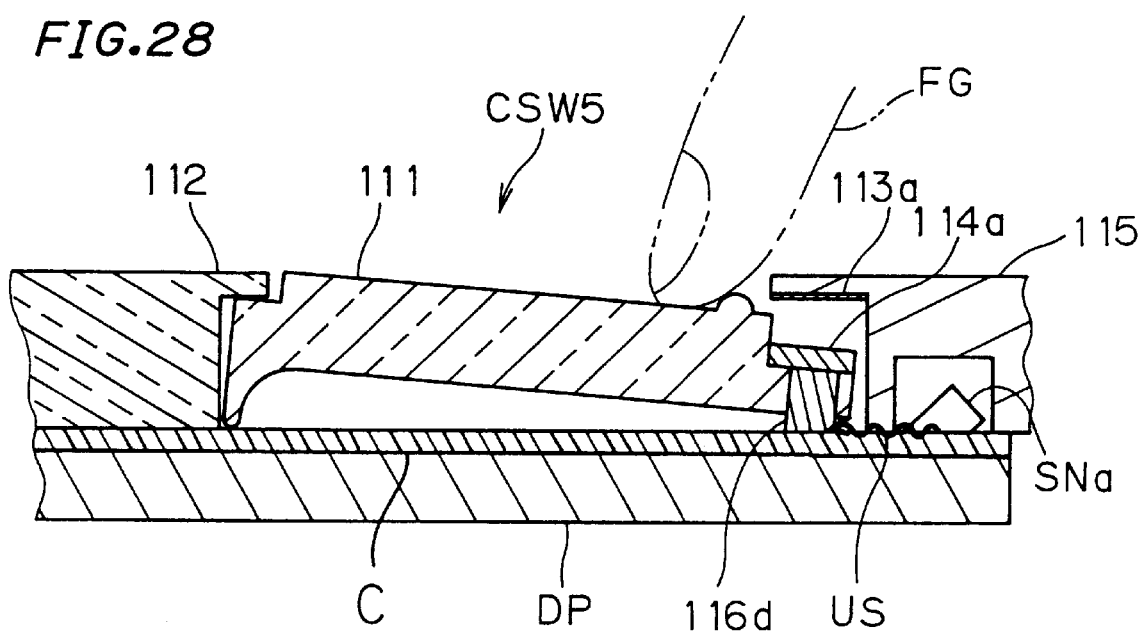
Figure 29:
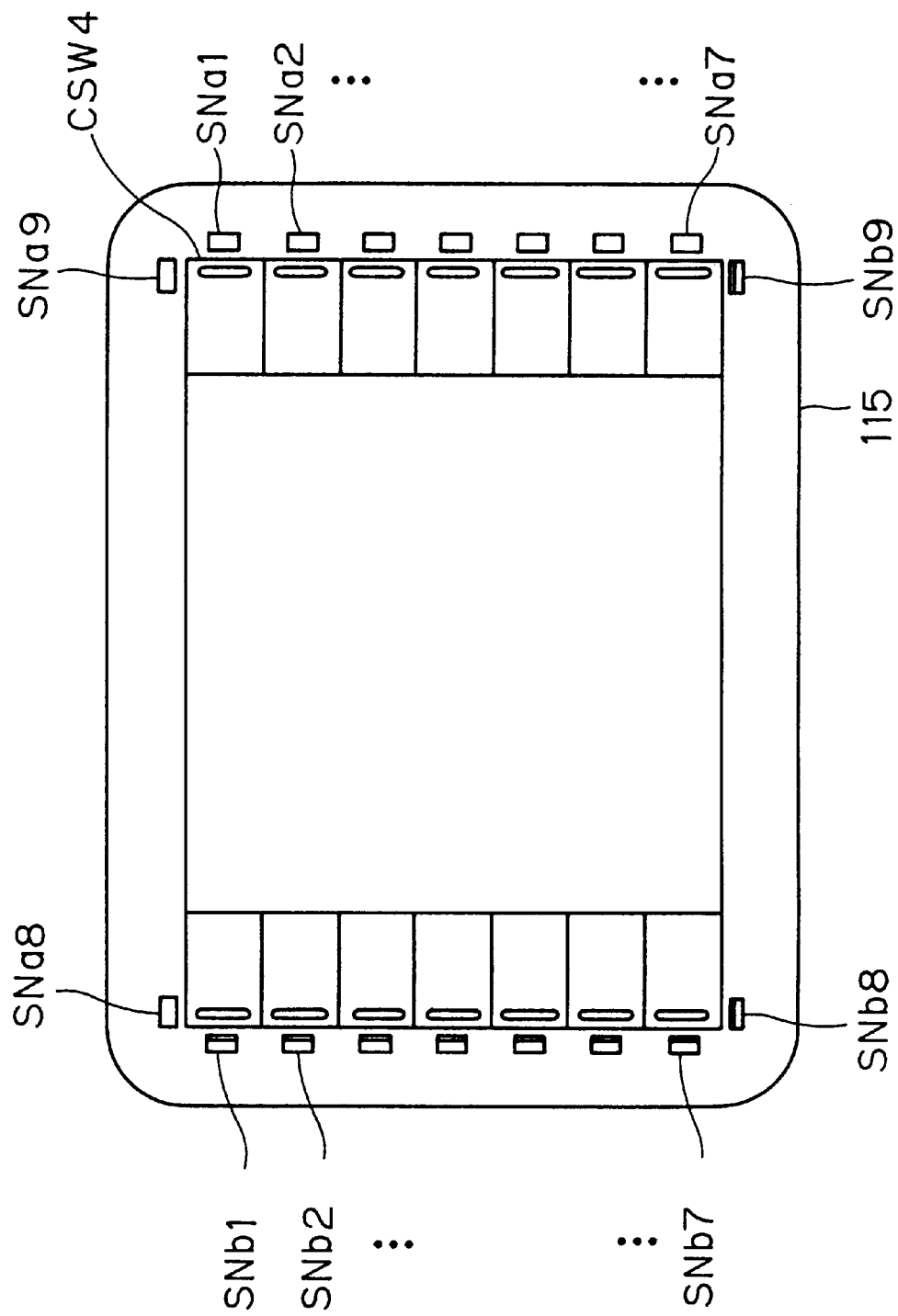
FIG. 29 is a diagram showing a utilization mode of an ultrasonic touch switch.

FIG. 27 to FIG. 29 are diagrams showing an exemplary structure in the case of employing an ultrasonic touch switch. FIG. 27 and FIG. 28 are diagrams showing a section of switch operating means CSW5, FIG. 27 shows such an unpushed state of the switch operating means CSW5, and FIG. 28 shows a pushed state of the switch operating means CSW5. In a casing 115, ultrasonic oscillators SNa1 to SNa9 (hereinafter referred to as "SNa") and ultrasonic sensors SNb1 to SNb9 (hereinafter referred to as "SNb") are arranged to be opposed to each other as shown in FIG. 29.

This switch operating means CSW5 obtains restoring force of the switch operating means through attraction of a magnet 114a and a magnetic metal plate 113a, similarly to the first embodiment. In the state of FIG. 27, an ultrasonic wave US oscillated from the ultrasonic oscillator SNa is transmitted on a surface of a transparent waveguide plate C made of glass or plastic placed on a display DP toward the ultrasonic sensor SNb arranged in opposition. When the switch operating means CSW5 is pushed, an ultrasonic wave absorber 116d mounted on a switch operating body 111 absorbs/blocks the ultrasonic wave US not to be transmitted to the ultrasonic sensor SNb. Therefore, the positions of the pushed switch operating means CSW5 in upper, lower, left and right directions are specified respectively from outputs of the ultrasonic sensors SNb1 to SNb7 and outputs of SNb8 and SNb9 in FIG. 29, so that which switch operating means CSW5 is pushed can be detected.

By thus utilizing a switching mechanism having no electrical contact in switching, a longer life is implemented as compared with that having a contact such as a touch switch of the resistor film type or the like.

While switch operating means having a mechanical mechanism has been described in the second embodiment as an example of switch operating means employing no touch switch TP, a switching principle of a photoelectric switch or a Hall element may be utilized.

Figure 30:
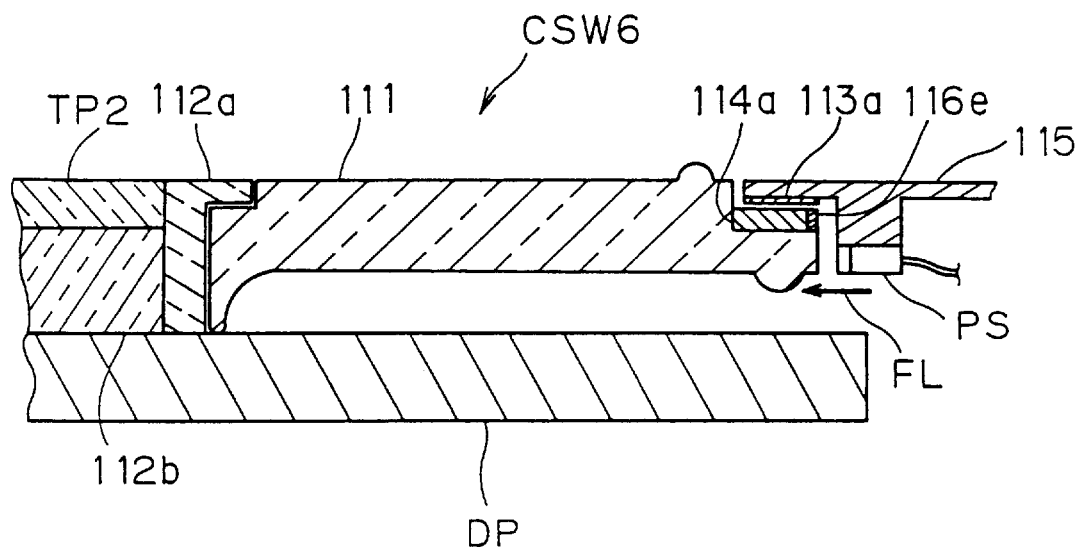
FIG. 30 and FIG. 31 are sectional views of the switch operating means.
Figure 31:
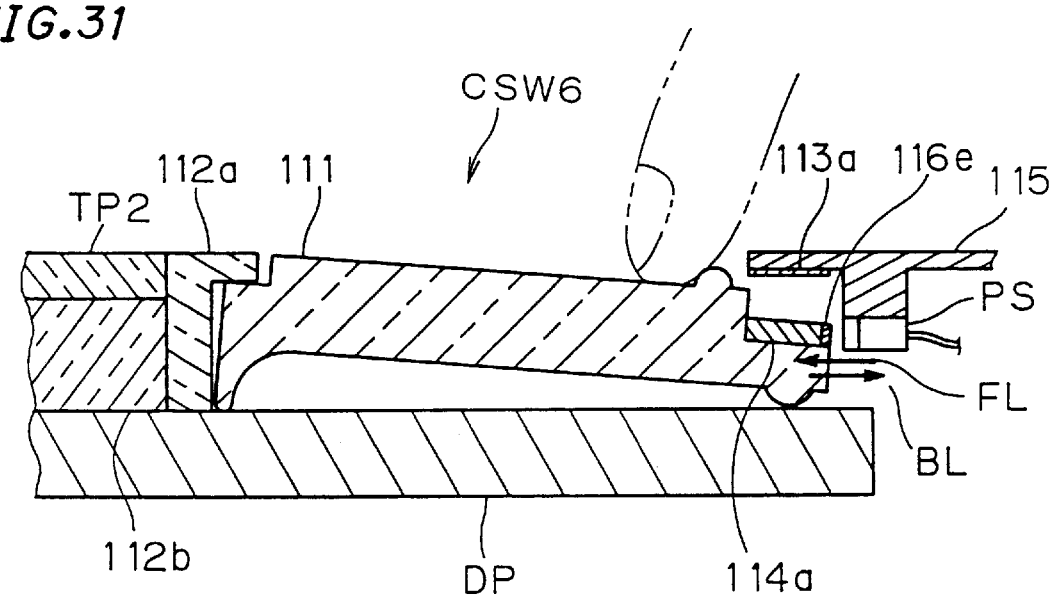

FIG. 30 and FIG. 31 are sectional views showing an example of switch operating means CSW6 employing a reflective photoelectric switch PS. FIG. 30 shows an unpushed state, and FIG. 31 shows a pushed state. For restoring force of the switch operating means CSW6, attraction of a magnet 114a and a magnetic metal plate 113a is utilized similarly to the first embodiment.

A reflector 116e is provided on an end surface of a switch operating body 111 on the photoelectric switch PS side, so that light FL emitted from the photoelectric switch PS is reflected on the reflector 116e only when the switch operating means CSW6 is pushed, and returns to the photoelectric switch PS as reflected light BL.

While the reflective photoelectric switch PS is employed in FIG. 30 and FIG. 31, a transmission photoelectric switch (e.g., a photointerrupter) is also employable by providing a mechanism shading light when the switch operating means is pushed as a matter of course, and a simple structure capable of performing switching through magnetism by the magnet 114a can also be implemented when replacing the photoelectric switch PS with a Hall element and removing the reflector 116e.

The protective cover 112 also filling the role of a bridge may not be employed dissimilarly to the first to fourth embodiments but a central portion of a display DP not provided with the switch operating means CSW6 may be rendered capable of utilizing an input system through a touch switch TP2 by employing a structure formed by a transparent bridge 112a, a transparent spacer 112b and the touch switch TP2 as shown in FIG. 30 and FIG. 31.

While the first to fifth embodiments utilize the attraction of the magnet and the magnetic metal plate, the restoring force of the switch having a mechanical mechanism, elastic restoring force of the plate spring or the like as the method of obtaining the restoring force of the switch operating means, further, attraction or repulsion of magnets may be employable as a matter of course, or return means may be structured through elasticity of an elastic body such as rubber. Further, opposite arrangement of mounting the magnet 114a on the casing 115 while mounting the magnetic metal plate 113a on the switch operating body 111 may be employed.

Figure 32:
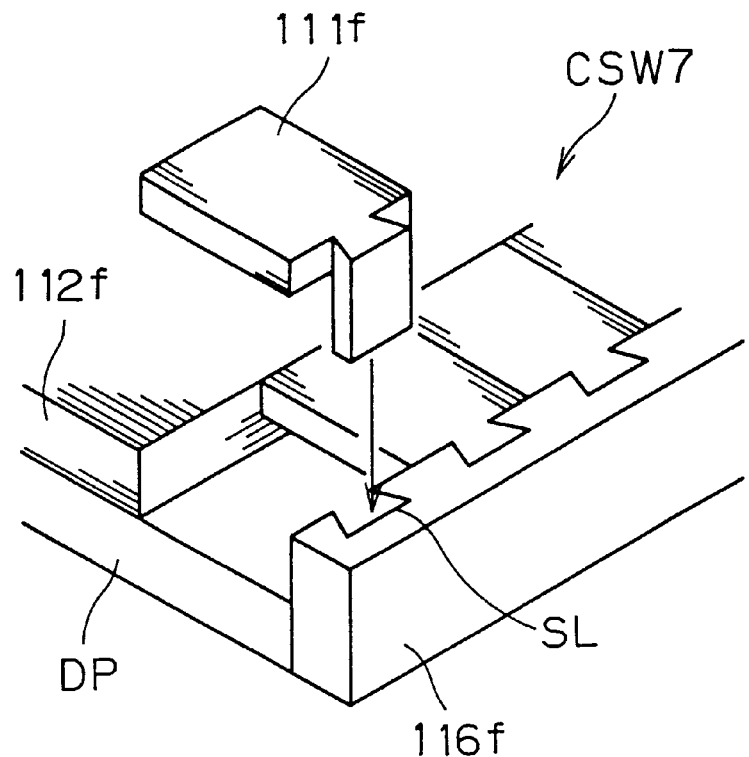
FIG. 32 and FIG. 33 are perspective views of the switch operating means.
Figure 33:
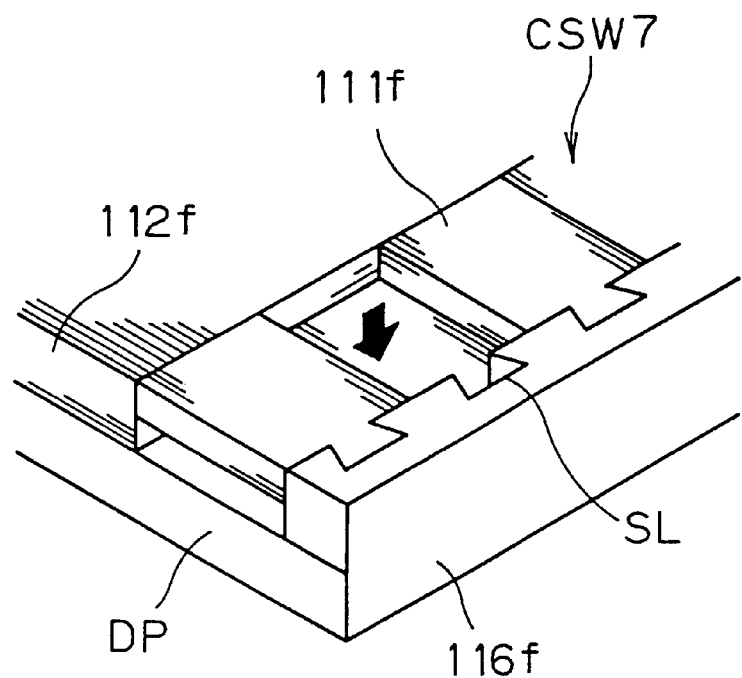

While the switch operating body 111 vertically moves through a hinge mechanism, a direct acting mechanism may be employed as shown in FIG. 32 and FIG. 33. A switch operating body 111f is inserted in a holder 116f as shown in FIG. 32 in switch operating means CSW7, so that the switch operating body 111 vertically moves along grooves SL of the holder 116f as shown in FIG. 33. While a transparent cover 112f is provided on an area of a display DP excluding the switch operating means CSW7, means for preventing the switch operating body 111 from coming off may be provided on the protective cover 112f or may not be provided but provided on the holder 116f side in this case. Provision on both is also available, as a matter of course.

Since the touch switch TP is provided on the overall surface on the display DP in the first and third to fifth embodiments, the touch switch TP may be effectively utilized by rendering the central portion of the protective cover 112 openable/closable leaving the portion filling the role of a bridge or an opening to be inputtable in the central portion with a pen or the like. On the contrary, the area provided with the touch switch TP may be saved by providing the touch switch TP only on the area provided with the switch operating means.

While the switch operating means CSW1 are provided on the left and right edges of the display DP of the display and input terminal CP2 in the third or fourth embodiment, one of the left and right sides is available. Further, the projection P on the rear surface of the terminal CP2 may also be on one of the left and right sides. When providing the switch operating means CSW1 only on the right peripheral edge portion of the display DP while also providing the projection P only at the back thereof at this time, an operation can be made with the right thumb while grasping the terminal CP2 only with the right hand.

The shape of the switch operating body 111 is not restricted to rectangular but may be triangular or circular.

Further, while the terminal CP2 makes communication with the exterior through a cable 107, wireless communication utilizing a radio wave or light may be employed, as a matter of course.

In the first to fifth embodiments, an upper surface part of a clearance around the switch operating body 111, more simply the whole of upper surfaces of the plurality of switch operating means arranged in parallel may be covered with a transparent thin sheet having flexibility. Thus, it is possible to prevent waterdrops or dust from entering the interior through the clearance around the switch operating body 111 and adhering to the surface of the touch panel TP to render the representation on the display DP hard to recognize. Thus, a waterproof and dustproof structure can be readily implemented by providing the sheet on the upper surfaces of the plurality of switch operating means.

Sixth Embodiment

Figure 34:
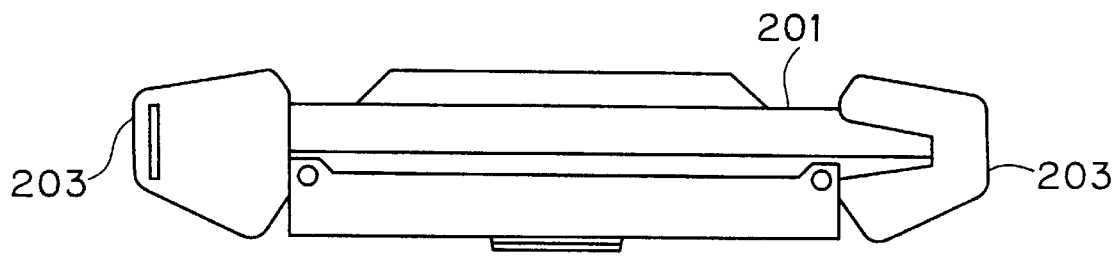
FIG. 34, FIG. 35 and FIG. 36 are a plan view, a front elevational view and a right side elevational view showing a portable display and input device according to a sixth embodiment respectively.
Figure 35:
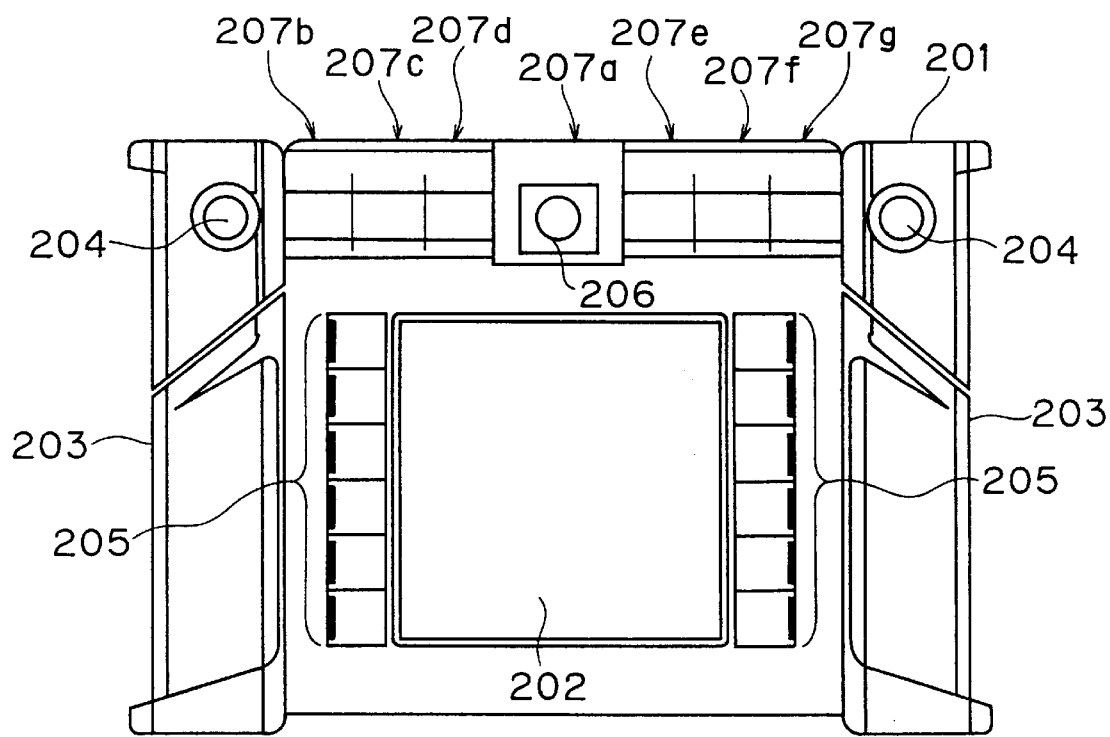
Figure 36:
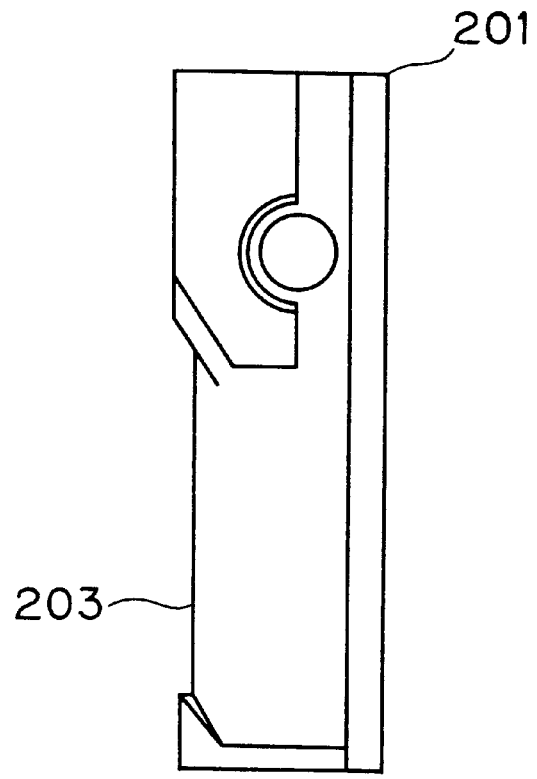

FIG. 34 to FIG. 36 are diagrams showing a portable display and input device according to a sixth embodiment of the present invention, and FIG. 34, FIG. 35 and FIG. 36 are a plan view, a front elevational view and a right side elevational view of the portable display and input device respectively. The display and input device 201 arranges a display 202 such as an LCD which is a monitor on a central portion of its front surface, and comprises grip parts 203 on left and right side portions. Arrangement spaces 204 for input/output parts are formed on upper portions of the left and right grip parts 203, and six switches 205 are arranged on each of the left and right sides of the display 202. Switches having those substantially similar to the switch operating means shown in the first and second embodiments are employed as the switches 205, and the display 202 horizontally spreads and exists inside a casing up to under these switches 205.

Figure 37:
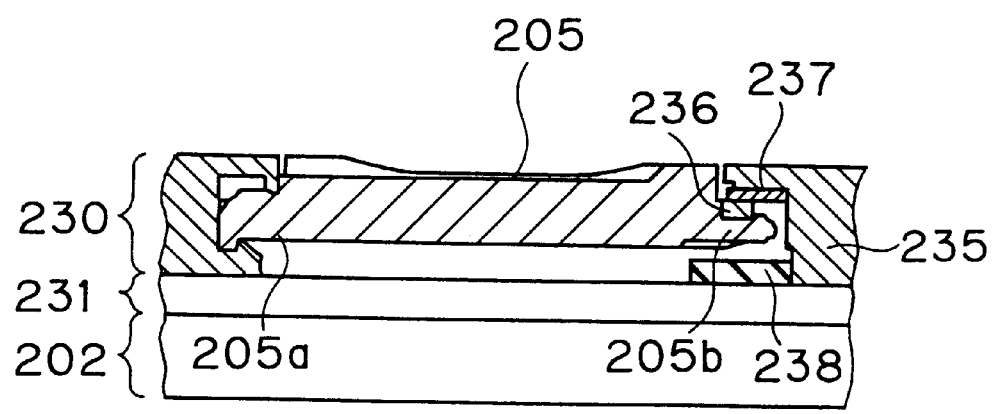
FIG. 37 is a sectional view of a switch arranged on a display.

Concretely, a transparent touch panel 231 is arranged on the upper surface of the display 202, and a console panel 230 having a switch 205 corresponding to the switch operating body in the first embodiment is arranged thereon, as shown in FIG. 37. The switch 205 of a transparent resin plate is rendered rotatable about a side 205a, while a magnet 236 is fixed to another side 205b parallel to this side 205a. In such a state that no downward operating force acts on the switch 205, the magnet 236 is magnetically attracted by a magnetic plate 237 positioned on an upper side of a frame body 235, and a rubber sheet 238 is positioned under a portion of the switch 205 to which the magnet 236 is fixed in this state through a clearance. The lower surface of this rubber sheet 238 is closely in contact with the upper surface of the touch panel 231.

When downward operating force acts on the switch 205, the other side 205b to which the magnet 236 is fixed rotates downward about the side 205a so that the switch 205 presses the touch panel 231 through the rubber sheet 238. Thus, the press operation of the switch 205 is detected by the touch panel 231. By this structure, sufficient operation feeling such as stroke feeling and click feeling can be obtained also when operating the touch panel on the upper surface of the display 202. Further, a portion opposed to the lower surface of the switch 205 which is a transparent resin plate can also be visually recognized through the switch 205 in the display 202, whereby not only the function and the operating state of each switch 205 can be displayed on this portion but also the overall surface of the display 202 can be integrally used as a screen.

The switches 205 are positioned on the display 202 on the sides of the left and right grip parts 203. Therefore, an operator grasping the left and right grip parts 203 substantially horizontally moves the thumbs of both hands to the front surface of the display and input device 201, whereby the thumbs are opposed to any of the switches 205 provided by six on each of the left and right sides. Therefore, the operator grasping the display and input device 201 with both hands can readily press/operate every one of the switches 205.

Arrangement spaces 207a to 207g for input/output parts are formed on an upper portion of the front surface of the display and input device 201. A camera 206 which is an image input part is arranged in the central arrangement space 207a. This camera 206 is formed by a CCD camera, for example. The camera 206 is positioned on the central portion of the upper side of the front surface of the display and input device 201, and opposed to the face of the operator grasping the display and input device 201 with both hands. Thus, it is possible to acquire an image of the face of the operator grasping the display and input device 201 or the background of the operator with the camera 206. Namely, the camera 206 is an input part for picture information.

In the arrangement spaces 207b to 207g formed on the left and right sides through the central arrangement space 207a, input/output parts such as an input operating part such as a switch, a voice input part such as a microphone and a voice output part such as a speaker can be arranged.

The input/output part arranged in the arrangement space 207a is not restricted to the camera 206.

Figure 38:
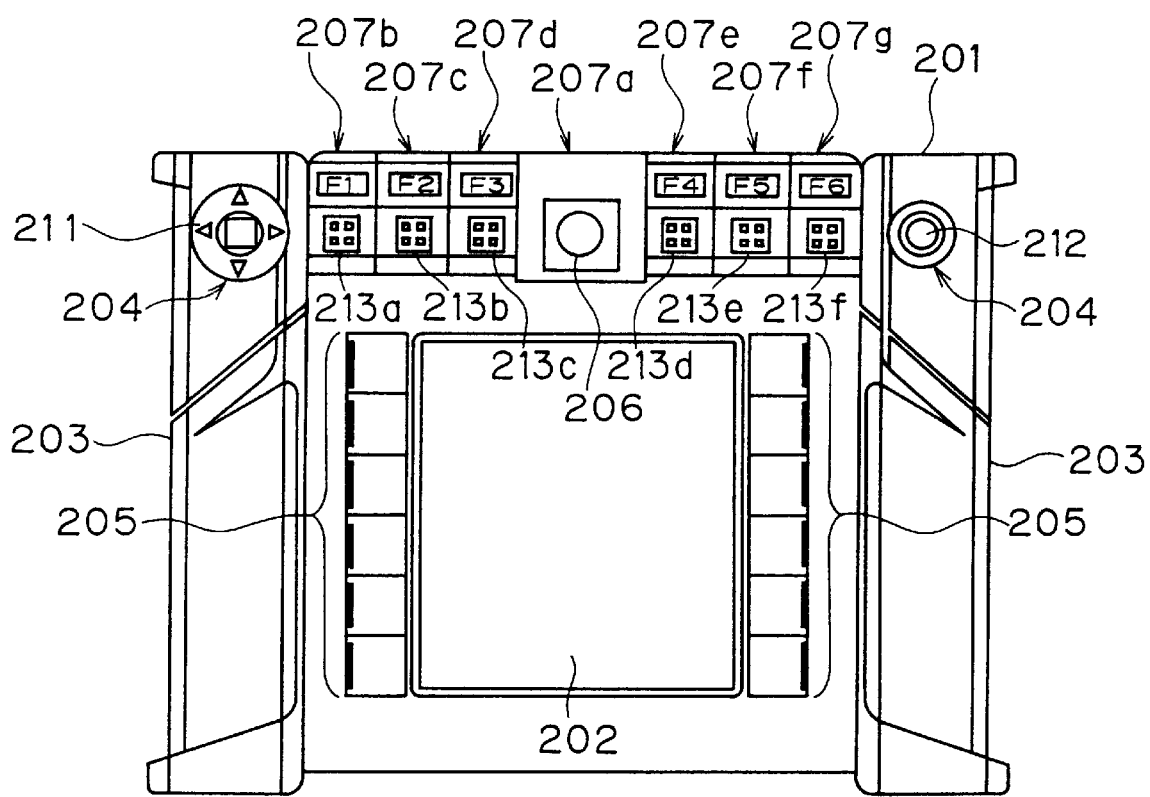
FIG. 38, FIG. 39 and FIG. 40 are front elevational views showing first, second and third use examples of the portable display and input device respectively.

FIG. 38 is a front elevational view showing a first use example of the aforementioned portable display and input device. In the display and input device 201, a lever switch 211 which is an input operating part is arranged in an arrangement space 204 on the upper portion of the left grip part 203. The lever switch 211 is operable in left, right, upper and lower four directions, and operated when moving a cursor displayed on the display 202, for example. This lever switch 211 is close to the left hand of the operator grasping the left grip part 203. Therefore, the operator can move the cursor by operating the lever switch 211 with the left thumb while grasping the display and input device 201.

In the display and input device 201, further, a push switch 212 which is an input operating part is arranged in the arrangement space 204 on the upper portion of the right grip part 203. The push switch 212, which is adapted to open/close an internal contact by a press operation, can be used as a power supply switch for the display and input device 201, for example. This push switch 212 is close to the right hand of the operator grasping the right grip part 203. Therefore, the operator can turn on/off the power by operating the push switch 212 with the right thumb while grasping the display and input device 201.

In the display and input device 201, further, push switches 213a to 213f which are input operating parts are arranged in the respective ones of the arrangement spaces 207b to 207g on the upper portion of the display 202. The push switches 213a to 213f, which are adapted to detect presence/absence of the press operation by the operator, can be used as function keys related to data processing in the display and input device 201, for example. Among the push switches 213a to 213f, the push switches 213a to 213c arranged on the left side of the camera 206 are close to the left hand of the operator grasping the left grip part 203, and the push switches 213d to 213f arranged on the right side of the camera 206 are close to the right hand of the operator grasping the right grip part 203. Therefore, the operator can set/input processing contents by operating any of the push switches 213a to 213f with both thumbs while grasping the display and input device 201.

The input/output parts arranged in the arrangement space 204 and the arrangement spaces 207b to 207g are not restricted to the lever switch and the push switches.

Figure 39:
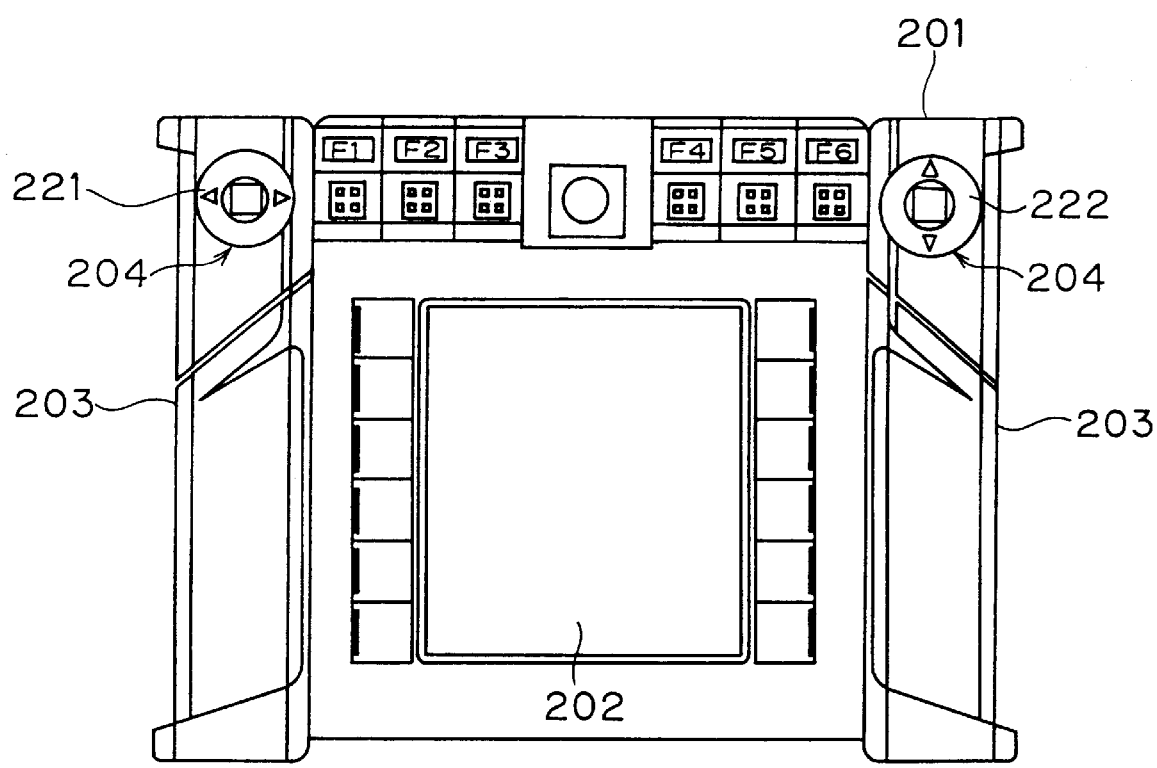

FIG. 39 is a front elevational view showing a second use example of the aforementioned portable display and input device. In the display and input device 201, lever switches 221 and 222 which are input operating parts are arranged in the respective ones of the arrangement spaces 204 on the upper portions of the left and right grip parts 203. The lever switch 221 is operable in the horizontal direction while the lever switch 222 is operable in the vertical direction, and operated when moving a cursor displayed on the display 202, for example. The lever switch 221 is close to the left hand of the operator grasping the left grip part 203, while the lever switch 222 is close to the right hand of the operator grasping the right grip part 203. Therefore, the operator can move the cursor by operating the lever switches 221 and 222 with both thumbs while grasping the display and input device 201.

Figure 40:
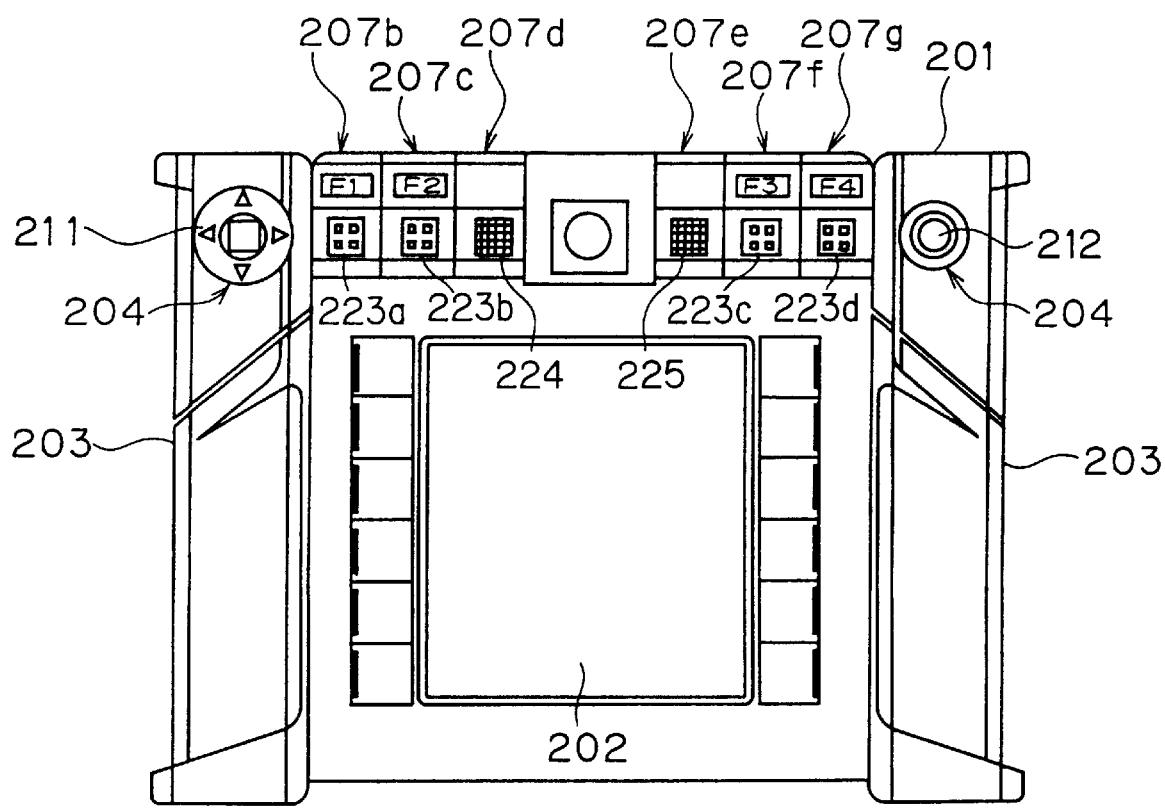

FIG. 40 is a front elevational view showing a third use example of the aforementioned portable display and input device. Push switches 223a to 223d which are input operating parts are arranged in the respective ones of the arrangement spaces 207b, 207c, 207f and 207g among the arrangement spaces 207b to 207g on the upper portion of the display 202 in the display and input device 201. The push switches 223a to 223d are adapted to detect presence/absence of the press operation by the operator, as described above. Among the push switches 223a to 223d, the push switches 223a and 223b arranged on the left side of the camera 206 are close to the left hand of the operator grasping the left grip part 203, while the push switches 223c and 223d arranged on the right side of the camera 206 are close to the right hand of the operator grasping the right grip part 203. Therefore, the operator can set/input processing contents by operating any of the push switches 223a to 223d with both thumbs while grasping the display and input device 201.

In the display and input device 201, further, a microphone 224 which is an input part for voice information is arranged in the arrangement space 207d and a speaker 225 which is an output part for voice information is arranged in the arrangement space 207e among the arrangement spaces 207b to 207g on the upper portion of the display 202. The microphone 224 collects external sounds and converts the same to voice data. The speaker 225 rumbles through the voice data and generates sounds. This microphone 224 and the speaker 225 are opposed to substantially the front surface of the face of the operator grasping the display and input device 201 with both hands. Therefore, the operator can input voice data through the microphone 224 by raising voice while grasping the display and input device 201, and can listen to sounds generated by the speaker 225 while grasping the display and input device 201.

The microphone 224 and the speaker 225 are arranged through the camera 206 arranged in the central arrangement space 207a. Therefore, it follows that a prescribed clearance is formed between the microphone 224 and the speaker 225, and the microphone 224 can be prevented from collecting sounds or vibration generated from the speaker 225 as noise. Further, collection of noise in the microphone 224 can be more reliably prevented by arranging the microphone 224 and the speaker 225 in the respective ones of the arrangement spaces 207b and 207g positioned on both ends among the arrangement spaces 207a to 207g on the upper portion of the display 202.

In addition, the operating parts, the voice input part and the voice output part among the input/output parts may be modularized by forming the shapes of the microphone 224 and the speaker 225 identically to the shapes of the respective ones of the push switches 223a to 223d for arranging input/output parts of arbitrary structures in the arrangement spaces 207b to 207g.

While the display and input device 201 according to the sixth embodiment has been described above, the transparent switches 205 are arranged on the left and right sides of the display 202 while the input/output parts are arranged in the range of movement of both thumbs when grasping the display and input device 201 with both hands in this display and input device 201. Thus, operability of various switches can be rendered excellent when grasping the portable display and input device with both hands from the left and right sides, functions of various input/output parts can also be sufficiently exhibited. Also as to the transparent switches in the sixth embodiment, various modifications are available as the first to fifth embodiments or the modifications of these embodiments.

While the respective embodiments of the present invention have been described, the range of the present invention is not restricted to the aforementioned embodiments but defined by the attached scope of claim.

What is claimed is:

1. A device for displaying information and accepting manual input, comprising:
   (a) a display having a display area;
   (b) a display controller for controlling said display to represent objective contents in a central region of said display area and represent a selection menu in a peripheral region of said display area;

(c) switching operation means comprising:
(i) a manual operation member provided on said peripheral region and displaceable toward said peripheral region when manual switching force is applied to said manual operation member, said manual operation member substantially transparent on said peripheral region, said manual operation member being a transparent member provided on said peripheral region and displaceable from an original position toward said peripheral region when manual switching force is applied to said transparent member;
(ii) switch means for switching a signal response to displacement of said manual operation member, said switch means comprising a transparent touch switch provided on said display area;
(iii) first magnetic means fixed to said transparent member; and
(iv) second magnetic means provided at a position around said display area to face said first magnetic means, said first and second magnetic means being arranged with respect to each other such that said transparent member returns to said original position by magnetic interaction between said first and second magnetic means after said manual switching force is inactivated; and (d) changing means for changing representation on said display area in response to switching by said switch means.

2. The device according to claim 1, further comprising:
means for expanding a representation size of said objective contents to said peripheral region in response to manual operation of said switching operation means.

3. The device according to claim 1, further comprising:
a transparent plate provided on said central region of said display area and holding an edge of said transparent member.

4. The device according to claim 1, further comprising:
a portable casing for housing said display and said switching operation means, said portable casing having a front surface provided with a window through which said display area is exposed,
wherein said switching operation means is located at a peripheral portion of said window.

5. The device according to claim 4, wherein
said switching operation means is on a front surface of said casing adjacent to at least one of the sides of said window;
said portable casing is provided with at least one grippable projection formed on a back surface of said portable casing; and
at least one grippable projection is located at the same side as said switching operation means.

6. The device according to claim 4, wherein
said portable casing is provided with grippable portions provided at opposite sides of said portable casing and grippable by both hands of an operator,
said device further comprising:
at least one electronic input and/or output element provided at a location on a front surface of said portable casing where said operator can access said element by at least one of his/her thumbs while gripping said grippable portions by said both hands.

7. The device according to claim 6, wherein
said at least one electronic input and/or output element includes at least one of an input operation element, a camera, a microphone and a speaker.

8. The device according to claim 6, wherein said window has a top side and a bottom side,
said front surface of said portable casing has a top frame region adjacent to said top side of said window, and
said at least one electronic input and/or output element includes:
a camera provided on a center position of said top frame region; and
a microphone and a speaker separately provided at respective sides of said center position in said top frame region.

9. The device of claim 1, wherein said selection menu in said peripheral region of said display area is located directly beneath said manual operation member such that said selection menu can be seen through said manual operation member.

10. A device for displaying information and accepting manual input, comprising:
(a) a display having a display area;
(b) a display controller for controlling said display to represent objective contents in a central region of said display area and represent a selection menu in a peripheral region of said display area;
(c) switching operation means comprising:
(i) a manual operation member provided on said peripheral region and displaceable toward said peripheral region when manual switching force is applied to said manual operation member with a finger to generate a stroke feeling in said finger, said manual operation member substantially transparent on said peripheral region; and
(ii) switch means for switching a signal response to displacement of said manual operation member, said switch means comprising a transparent touch switch provided on said display area;
(d) changing means for changing representation on said display area in response to switching by said switch means;
(e) a portable casing for housing said display and said switching operation means, said portable casing having a front surface provided with a window through which said display area is exposed, wherein said switching operation means is located at a peripheral portion of said window, said portable casing being provided with grippable portions provided at opposite sides of said portable casing and grippable by both hands of an operator, said window having a top side and a bottom side, and said front surface of said portable casing having a top frame region adjacent to said top side of said window;
(f) at least one electronic input and/or output element provided at a location on a front surface of said portable casing where said operator can access said element by at least one of his/her thumbs while gripping said grippable portions by said both hands, said at least one electronic input and/or output element including:
(i) a camera provided on a center position of said top frame region; and
(ii) a microphone and a speaker separately provided at respective sides of said center position in said top frame region;
(g) a detector for detecting a first stage of application of said manual switching force to said manual operation member to determine a selected item among said selection menu; and (h) means for making said selected item recognizable in response to said first stage, wherein said switch means is activated in response to a second stage of said application of said manual force to said manual operation member to change representation on said display area.

11. A system for displaying information and accepting manual input, comprising:

(A) a plurality of terminal devices each comprising:
  (i) a display having a display area;
  (ii) a display controller for controlling said display to represent objective contents in a central region of said display area and represent a selection menu in a peripheral region of said display area; and
  (iii) switching operation means comprising:
    a) a manual operation member provided on said peripheral region and displaceable toward said peripheral region when manual switching force is applied to said manual operation member with a finger to generate a stroke feeling in said finger, said manual operation member substantially transparent on said peripheral region, said manual operation member being a transparent member provided on said peripheral region and displaceable from an original position toward said peripheral region when manual switching force is applied to said transparent member;
    b) switch means for switching a signal in response to displacement of said manual operation member, said switch means comprising a transparent touch switch provided on said display area;
    c) first magnetic means fixed to said transparent member; and
    d) second magnetic means provided at a position around said display area to face said first magnetic means, said first and second magnetic means being arranged with respect to each other such that said transparent member returns to said original position by magnetic interaction between said first and second magnetic means after said manual switching force is inactivated; and (B) a main data processor operable to communicate with said plurality of terminal devices.

12. The system of claim 11, wherein said selection menu in said peripheral region of said display area is located directly beneath said manual operation member such that said selection menu can be seen through said manual operation member.

13. A system for displaying information and accepting manual input, comprising:

(A) a plurality of terminal devices each comprising:
  (i) a display having a display area;
  (ii) a display controller for controlling said display to represent objective contents in a central region of said display area and represent a selection menu in a peripheral region of said display area;
  (iii) switching operation means comprising:
    (a) a manual operation member provided on said peripheral region and displaceable toward said peripheral region when manual switching force is applied to said manual operation member with a finger to generate a stroke feeling in said finger, said manual operation member substantially transparent on said peripheral region; and
    (b) switch means for switching a signal response to displacement of said manual operation member, said switch means comprising a transparent touch switch provided on said display area;
  (iv) changing means for changing representation on said display area in response to switching by said switch means;
  (v) a portable casing for housing said display and said switching operation means, said portable casing having a front surface provided with a window through which said display area is exposed, wherein said switching operation means is located at a peripheral portion of said window, said portable casing being provided with grippable portions provided at opposite sides of said portable casing and grippable by both hands of an operator, said window having a top side and a bottom side, and said front surface of said portable casing having a top frame region adjacent to said top side of said window;
  (vi) at least one electronic input and/or output element provided at a location on a front surface of said portable casing where said operator can access said element by at least one of his/her thumbs while gripping said grippable portions by said both hands, said at least one electronic input and/or output element including: a camera provided on a center position of said top frame region; and a microphone and a speaker separately provided at respective sides of said center position in said top frame region;
  (vii) a detector for detecting a first stage of application of said manual switching force to said manual operation member to determine a selected item among said selection menu;
  (viii) means for making said selected item recognizable in response to said first stage, wherein said switch means is activated in response to a second stage of said application of said manual force to said manual operation member to change representation on said display area; and (B) a main data processor operable to communicate with said plurality of terminal devices.

* * * * *